United States Patent [19]
Okumura et al.

[11] Patent Number: 5,922,223
[45] Date of Patent: Jul. 13, 1999

[54] PLASMA PROCESSING METHOD AND APPARATUS

[75] Inventors: Tomohiro Okumura, Kadoma; Hideo Haraguchi, Toyonaka; Ichiro Nakayama, Kadoma; Yoshihiro Yanagi, Neyagawa, all of Japan

[73] Assignee: Matsushita Electric Industrial Co., Ltd., Kadoma, Japan

[21] Appl. No.: 08/749,847

[22] Filed: Nov. 15, 1996

[30] Foreign Application Priority Data

Nov. 16, 1995 [JP] Japan ................................. 7-297993
Nov. 16, 1995 [JP] Japan ................................. 7-297994

[51] Int. Cl.$^6$ .................................................. B23K 10/00
[52] U.S. Cl. .............................. 219/121.43; 219/121.52; 219/121.4; 156/345; 204/298.31; 118/723 I; 315/111.51
[58] Field of Search ........................ 219/121.4, 121.41, 219/121.43, 121.52, 121.48, 695; 156/643.1, 646.1, 345; 204/298.37, 298.38, 298.15, 298.17, 298.31; 315/111.21–111.81

[56] References Cited

U.S. PATENT DOCUMENTS

| | | | |
|---|---|---|---|
| 4,367,388 | 1/1983 | Ishihara et al. ................... | 219/10.55 B |
| 5,002,631 | 3/1991 | Giapis et al. ........................ | 156/643.1 |
| 5,277,751 | 1/1994 | Ogle ...................................... | 156/643 |
| 5,436,528 | 7/1995 | Paranjpe . | |
| 5,558,722 | 9/1996 | Okumura et al. ..................... | 118/723 I |
| 5,589,737 | 12/1996 | Barnes et al. ....................... | 315/111.21 |
| 5,650,032 | 7/1997 | Keller et al. .............................. | 156/345 |
| 5,735,993 | 4/1998 | Yoshida .................................... | 156/345 |
| 5,792,261 | 8/1998 | Hama et al. ........................... | 118/723 I |

FOREIGN PATENT DOCUMENTS

| | | |
|---|---|---|
| 3075389 | 3/1991 | Japan . |
| 4002691 | 1/1992 | Japan . |

*Primary Examiner*—Mark Paschall
*Attorney, Agent, or Firm*—Wenderoth, Lind & Ponack, L.L.P.

[57] ABSTRACT

A plasma processing method and apparatus, wherein evaluation is effected while a suitable gas is introduced into a vacuum vessel, and then a high frequency voltage is applied by a high frequency discharge coil power source to a spiral discharge coil while the interior of the vacuum vessel is kept under adequate pressure, whereby a high frequency magnetic field is generated within the vacuum vessel through a dielectric plate so that electrons are accelerated by an induction field due to the high frequency magnetic field to generate plasma within the vacuum vessel for processing a substrate, characterized in that the dielectric plate is heated by a planar heater to 80° C. or more, whereby the thickness of a thin film to be deposited on the dielectric plate is substantially reduced thereby to inhibit dust generation and thus substantially reduce the frequency of maintenance required for the dielectric plate. The apparatus includes a ceramic plate formed with a discharge coil fixing groove and mounted on the dielectric plate, and the planar spiral discharge coil is mounted on the ceramic plate.

31 Claims, 20 Drawing Sheets

PLASMA PROCESSING METHOD AND APPARATUS

BACKGROUND OF THE INVENTION

The present invention relates to a plasma processing method and apparatus for use in dry etching, sputtering, plasma CVD, and the like and, more particularly, to a plasma processing method and apparatus of a high frequency induction system.

In recent years, to effect processing or the like on a semiconductor element at a high aspect ratio by a dry etching technique or effect burying or the like at a high aspect ratio by a plasma CVD technique, coping with developing dimensional fineness of semiconductor elements, it has been required to effect plasma processing in higher vacuum.

For instance, in the case of dry etching, when a high density plasma is generated in high vacuum, there is a reduced possibility of collision between ions and neutral radical particles in an ion sheath formed on a substrate surface, and therefore directions of the ions are aligned toward the substrate surface. Furthermore, because of a high degree of electrolytic dissociation, there results a high incident particle flux ratio of ions to neutral radicals arriving at the substrate. For the above-mentioned reasons, etching anisotropy is improved by generating high density plasma in high vacuum, thereby allowing processing to be achieved at a high aspect ratio.

Furthermore, in the case of plasma CVD, when a high density plasma is generated in high vacuum, an effect of burying and flattening a fine pattern can be obtained by the sputtering effect with ions, thereby allowing burying to be achieved at a high aspect ratio.

As one such plasma processing apparatus capable of generating a high density plasma under high vacuum there has been known a plasma processing apparatus of a high frequency induction system such that plasma is generated within a vacuum vessel by applying a high frequency voltage to a planar spiral discharge coil. A plasma processing apparatus of this system causes a high frequency magnetic field to be generated within the vacuum vessel so that an induction electric field is generated through the high frequency magnetic field within the vacuum vessel to accelerate electrons for plasma generation. As such, by increasing the intensity of the current flowing across the coil it is possible to generate high density plasma under high vacuum, thus obtaining sufficient processing rate.

A plasma processing apparatus of the high frequency induction system is shown by way of example in FIG. 8. In FIG. 8, evacuation is effected while a suitable gas is being introduced into a vacuum vessel 1, and a high frequency voltage is applied by a high frequency power source 2 for discharge coil to a planar spiral discharge coil 4 disposed on a dielectric plate 3 while the interior of the vacuum vessel 1 is kept under adequate pressure, whereupon plasma is generated within the vacuum vessel 1, it being thus possible to carry out plasma processing in connection with such operations as etching, deposition, and surface modification with respect to a substrate 6 placed on an electrode 5. In this case, a high frequency voltage is applied to the electrode 5 by a high frequency power source 7 for electrode, as shown in FIG. 8, whereby ion energies reaching the substrate 6 can be controlled.

However, with the conventional system shown in FIG. 8, one issue is that a large quantity of a reaction product deposits on the dielectric plate, which gives rise to dust generation and maintenance cycle deterioration. Another issue is that the atmosphere within the vacuum vessel is not stabilized, with the result that the system can only exhibit poor reproducibility in plasma processing.

More specifically, in the case of plasma CVD, in the course of thin film deposition on the substrate, similar thin films deposit also on the dielectric plate. In the case of dry etching, substances produced through an etching reaction and/or a vapor phase reaction may become thin-filmed on the dielectric plate. In the course of processing cycles being repeated, such film deposits grow in thickness and, when the thickness of such film deposit exceeds a certain level, peeling may occur due to film stress, resulting in peeled films falling on the substrate in the form of dust. In the conventional system shown in FIG. 8, dust generation is likely to occur when only a small number of substrates is processed and this requires frequent cleaning (maintenance) of the dielectric plate with pure water or ethanol.

In the course of processing cycles being repeated, changes occur in the thickness of film deposition as already mentioned, and this results in changes in radical adsorption and in the atmosphere within the vacuum vessel, that is, partial pressures of reaction species, which adversely affect the reproducibility of plasma processing. An increase in the temperature of the dielectric plate due to heating by high energy ions impinging upon the dielectric plate is also a cause of a change in the rate of radical adsorption.

Moreover, with the conventional system shown in FIG. 18, another issue is that as cycles of processing are repeated in succession, the temperature of the dielectric plate 3 rises due to heating by high energy ions impinging upon the dielectric plate 3, with the result that the adhesion bond between the discharge coil 4 and the dielectric plate 3 is removed, which gives rise to deformation of the discharge coil 4. It has been found from experiments that if electric discharge is effected continuously for one hour by using Ar gas, the temperature of the dielectric plate 3 will rise up to 200° C.

Then, it was conceived to bond the discharge coil 4 to a ceramic plate or glass plate 15 as shown in FIG. 19, then mounting the ceramic plate or glass plate 15 on the dielectric plate 3. However, there occurred an issue that the discharge coil 4 expanded due to temperature rise with the result that the ceramic plate or glass plate 15 became fractured.

If the discharge coil 4 is deformed, the distribution density of plasma within the vacuum vessel 1 will become changed and this will deteriorate in-plane uniformity of processing. Any breakage caused to the ceramic plate or glass plate 15 may not only result in the deformation of the discharge coil 4, but also may lead to abnormal electric discharge in the atmosphere.

SUMMARY OF THE INVENTION

An object of the present invention is to provide a plasma processing method and apparatus which is less liable to generate dust requires less maintenance, and exhibits good reproducibility of plasma processing. Additionally, an object of the present invention is to provide a plasma processing method and apparatus which has its discharge coil stably fixed in position and is free from abnormal discharge possibility in the atmosphere.

In accomplishing these and other aspects, according to a first aspect of the present invention, there is provided a plasma processing method wherein an apparatus including a high frequency power source and a spiral discharge coil is employed, the plasma processing method comprising steps of:
applying a high frequency voltage by the high frequency power source to the discharge coil to generate a high frequency magnetic field within a vacuum chamber through a dielectric plate so that electrons are accelerated by an induction field due to the high frequency magnetic field to generate plasma within the vacuum chamber for processing a substrate; and
controlling a temperature of the dielectric plate.

According to a second aspect of the present invention, there is provided the plasma processing method as set forth in the first aspect, wherein in the controlling step, the temperature of the dielectric plate is so controlled that the dielectric plate is heated by a heating device to 80° C. or more.

According to a third aspect of the present invention, there is provided the plasma processing method as set forth in the first aspect for etching a silicon oxide film, wherein the temperature of the dielectric plate is so controlled that the dielectric plate is heated to 150° C. or more in the controlling step.

According to a fourth aspect of the present invention, there is provided the plasma processing method as set forth in the first aspect for etching a silicon nitride film, wherein the temperature of the dielectric plate is so controlled that the dielectric plate is heated to 150° C. or more in the controlling step.

According to a fifth aspect of the present invention, there is provided the plasma processing method as set forth in the second aspect, wherein the temperature of the dielectric plate is so controlled that the heating device for heating the dielectric plate is constructed by a planar heater which satisfies the relation:

$$Sh < Sy \times 0.4$$

where Sh represents an area of the planar heater; and Sy represents an area of the dielectric plate.

According to a sixth aspect of the present invention, there is provided the plasma processing method as set forth in the first aspect, wherein the spiral discharge coil is partially or wholly of a multiple spiral form.

According to a seventh aspect of the present invention, there is provided the plasma processing method as set forth in the first aspect, wherein in the controlling step, the temperature of the dielectric plate is adjusted while the temperature of the dielectric plate is being monitored.

According to an eighth aspect of the present invention, there is provided a plasma processing apparatus comprising:
a spiral discharge coil;
a high frequency power source for applying a high frequency voltage to the discharge coil to generate a high frequency magnetic field within a vacuum chamber through a dielectric plate so that electrons are accelerated by an induction field due to the high frequency magnetic field to generate plasma within the vacuum chamber for processing a substrate; and
a controller for controlling a temperature of the dielectric plate.

According to a ninth aspect of the present invention, there is provided the plasma processing apparatus as set forth in the eighth aspect, further comprising a heating device for heating the dielectric plate with resistance heat,
wherein the controller controls the temperature of the dielectric plate so that the dielectric plate is heated by the heating device to 80° C. or more.

According to a tenth aspect of the present invention, there is provided the plasma processing apparatus as set forth in the ninth aspect, wherein the heating device for heating the dielectric plate is constructed by a planar heater which satisfies the relation:

$$Sh < Sy \times 0.4$$

where Sh represents an area of the planar heater; and Sy represents an area of the dielectric plate.

According to an 11th aspect of the present invention, there is provided the plasma processing apparatus as set forth in the eighth aspect, wherein the spiral discharge coil is partially or wholly of a multiple spiral form.

According to a 12th aspect of the present invention, there is provided the plasma processing apparatus as set forth in the eighth aspect, further comprising a pressure mounted thermocouple, disposed on a side of the dielectric plate, for monitoring the temperature of the dielectric plate.

According to a 13th aspect of the present invention, there is provided the plasma processing apparatus as set forth in the eighth aspect, wherein the spiral discharge coil is mounted on a ceramic plate formed with a discharge coil fixing groove.

According to a 14th aspect of the present invention, there is provided the plasma processing apparatus as set forth in the 13th aspect, wherein the ceramic plate has a thickness of 5mm or less and an area of 350 $cm^2$ or less, and wherein the ceramic plate is comprised of a free-cutting ceramic material.

According to a 15th aspect of the present invention, there is provided the plasma processing apparatus as set forth in the 13th aspect, further comprising a heating device for heating the dielectric plate, the heating device being constituted by a planar heater provided between the ceramic plate and the dielectric plate.

According to a 16th aspect of the present invention, there is provided the plasma processing apparatus as set forth in the eighth aspect, wherein the spiral discharge coil is mounted on a glass plate formed with a discharge coil fixing groove.

According to a 17th aspect of the present invention, there is provided the plasma processing apparatus as set forth in the 16th aspect, wherein a thickness of the glass plate is 5 mm or less.

According to an 18th aspect of the present invention, there is provided the plasma processing apparatus as set forth in the 16th aspect, further comprising a heating device for heating the dielectric plate, the heating device being constituted by a planar heater provided between the glass plate and the dielectric plate.

According to a 19th aspect of the present invention, there is provided the plasma processing apparatus as set forth in the eighth aspect, wherein the spiral discharge coil is mounted on a free-cutting ceramic plate formed with a discharge coil fixing groove and divided into plural parts, and a glass plate or a ceramic plate is disposed between the free-cutting ceramic plate and the dielectric plate.

According to a 20th aspect of the present invention, there is provided the plasma processing apparatus as set forth in the 19th aspect, wherein a total area of the plural divided parts of the free-cutting ceramic plate is larger than 350 $cm^2$; a thickness of each divided part of the free-cutting ceramic plate is 5 mm or less; and an area of each divided part of the free-cutting ceramic plate is 350 $cm^2$ or less.

According to a 21st aspect of the present invention, there is provided the plasma processing apparatus as set forth in the 19th aspect, wherein a thickness of the glass plate or ceramic plate is 5 mm or less.

According to a 22nd aspect of the present invention, there is provided the plasma processing apparatus as set forth in the 19th aspect, further comprising a planar heater provided between the glass plate or ceramic plate and the dielectric plate.

According to a 23rd aspect of the present invention, there is provided the plasma processing apparatus as set forth in the 13th, 16th, and 19th aspects, wherein a second ceramic plate or glass plate is disposed above the spiral discharge coil.

According to a 24th aspect of the present invention, there is provided the plasma processing apparatus as set forth in the 13th, 16th, and 19th aspects, wherein the spiral discharge coil is partially or wholly of a multiple spiral configuration.

According to a 25th aspect of the present invention, there is provided a plasma processing apparatus comprising:

a spiral discharge coil mounted on a ceramic or glass plate formed with a discharge coil fixing groove; and a high frequency power source for applying a high frequency voltage to the discharge coil to generate a high frequency magnetic field within a vacuum chamber through a dielectric plate so that electrons are accelerated by an induction field due to the high frequency magnetic field to generate plasma within the vacuum chamber for processing a substrate.

Through such controlling the temperature of the dielectric plate, it is possible to substantially reduce the thickness of a thin film to be deposited on the dielectric plate as compared with the case in which no such controlling is carried out. When the temperature of the dielectric plate is so controlled that the dielectric plate is heated by a heating device to 80° C. or more, it is possible to inhibit dust generation since the film is more dense in quality than in the case where a lower temperature is used. Thus, the frequency of maintenance required with respect to the dielectric plate can be noticeably decreased. When processing cycles are repeated one after another, changes, if any, in the thickness of films deposited are insignificant, and the rate of radical adsorption will remain low without any appreciable change, because the temperature of the dielectric plate is kept high. Therefore, the atmosphere within the vacuum chamber, that is, partial pressure of reaction species, is kept stable, and this enables effective plasma processing with good reproducibility.

According to the third and fourth aspects of the present invention, in the case of plasma processing for silicon oxide film etching or silicon nitride film etching, the dielectric plate is heated to 150° C. or more, and this provides, in addition to the above mentioned advantage, a further advantage that adsorption of CF-based radicals, such as CF and $CF_2$, on the dielectric plate is noticeably decreased so that deposition of CF-based polymers on a substrate polysilicon is enhanced, which results in improvement in the select ratio of silicon oxide film or silicon nitride film/polysilicon for etching.

According to the fifth and ninth aspects of the present invention, where the device for heating the dielectric plate is constructed by the planar heater operative for electric resistance heating, the heating arrangement for the dielectric plate is very much simplified. Assume that the area of the planar heater is Sh and the area of the dielectric plate is Sy. If the relation Sh<Sy×0.4 holds, a high frequency magnetic field due to the spiral discharge coil is produced within the vacuum chamber without being interrupted by the planar resistance heater. Thus, electric discharge can be well maintained. It has been found that if the foregoing relation is not satisfied, electric discharge may be unstable; some reflected high frequency power may be produced; and in some extreme case, electric discharge cannot be maintained.

According to the sixth and tenth aspects of the present invention, preferably, the spiral discharge coil is partially or wholly of a multiple spiral shape so that the spiral discharge coil can be of low inductance.

According to the seventh and 11th aspects of the present invention, the temperature of the dielectric plate can be maintained high through temperature control of the dielectric plate while the temperature of the dielectric plate is being monitored. Thus, adsorption of radicals on the dielectric plate remains low without any substantial change. Therefore, the atmosphere within the vacuum chamber, that is, partial pressure of reaction species is kept stable and thus plasma processing can be carried out with good reproducibility.

According to the 11th aspect, for the purpose of temperature control of the dielectric plate to be carried out while the temperature of the dielectric plate is being monitored, the pressure contact type thermocouple may be mounted to the side of the dielectric plate. By so doing it is possible to reduce the effect of high frequency noise and, thus, temperature control can be performed with less malfunction possibility. This, coupled with the fact that the pressure contact type thermocouple has good thermal responsiveness, enables accurate temperature control.

According to the 13th and 25th aspects, in the event of any rise in the temperature of the dielectric plate due to heating by high energy ions impinging upon the dielectric plate, the engagement between the discharge coil and the ceramic plate is not liable to be damaged, nor is the discharge coil liable to become deformed. Even if the discharge coil should expand due to temperature rise, the ceramic plate is not liable to breakage because the discharge coil and the ceramic plate are not in adhesion bond, that is, the coil can move in the groove in accordance with the expansion of the coil.

According to the 14th aspect, the ceramic plate is preferably comprised of a free-cutting ceramic with a thickness of 5 mm or less and an area of 350 $cm^2$ or less. If power efficiency is considered, the ceramic plate formed with the discharge coil fixing groove is preferably less thick. This fact is described in detail in, for example, J. Hopwood, "Planar RF induction plasma coupling efficiency", Plasma Sources Sci. Technol, 3 (1994), pp.460–464. Already, it has been verified that where the area of a ceramic plate is 350 $cm^2$ or less, no cracks will occur with the ceramic plate, even if the ceramic plate is made of an inexpensive, free-cutting ceramic material and is 5 mm or less in thickness. Therefore, in case that the ceramic plate is 350 $cm^2$ or less in area, the ceramic plate may be of a free-cutting ceramic material and 5 mm or less in thickness, whereby the plasma processing apparatus which is inexpensive and exhibits good power efficiency can be provided.

According to the 15th aspect, preferably, the planar heater is provided between the ceramic plate and the dielectric plate. By so doing it is possible to stabilize the temperature of the dielectric plate, prevent dust generation, and achieve maintenance cycle improvement.

According to the 16th and 25th aspects, the planar spiral discharge coil may be provided on the glass plate formed with the discharge coil fixing groove. The use of the glass plate in place of the ceramic plate in this way will provide the similar effect. According to the 17th aspect, as in the case of the ceramic plate, the glass plate may be 5 mm thick or less, whereby the plasma processing apparatus which exhibits good power efficiency can be obtained. According to the 18th aspect, the provision of the planar heater between the glass plate and the dielectric plate can provide the same effect as earlier mentioned.

According to the 19th aspect, the planar spiral discharge coil may be mounted on the free-cutting ceramic plate which is formed with the discharge coil fixing groove and divided into the plural parts, and the glass plate or ceramic plate is disposed between the free-cutting ceramic plate and the dielectric plate. Through this arrangement, in the event of any rise in the temperature of the dielectric plate due to heating by high energy ions impinging against the dielectric plate, the engagement between the discharge coil and the free-cutting ceramic plate is not liable to be damaged, nor is the discharge coil liable to become deformed. In the case where the free-cutting ceramic plate is divided into parts, the presence of the glass plate or ceramic plate prevents any possible occurrence of abnormal electric discharge in the atmosphere.

According to the 20th aspect, in the case where the total area of the free-cutting ceramic plate divided into plural parts is larger than 350 $cm^2$, each divisional part of the free-cutting ceramic plate should be 5 mm or less in thickness and 350 $cm^2$ or less in area, and according to the 21st aspect, the glass plate or ceramic plate should be 5 mm or less in thickness. Through this arrangement, it is possible to provide the plasma processing apparatus which eliminates any possible occurrence of cracks with the free-cutting ceramic plate in the same manner as earlier mentioned, and which is less expensive and can exhibit good power efficiency. According to the 22nd aspect, the provision of the planar heater between the glass plate or ceramic plate and the dielectric plate can also provide the similar advantage.

According to the 23rd aspect, in the above described arrangement, the second ceramic plate or glass plate may be provided above the planar spiral discharge coil. This provides more firm engagement between the discharge coil and the ceramic plate or glass plate which is formed with the discharge coil fixing groove, and can therefore serve to more effectively prevent any deformation of the discharge coil. Further, according to the 24th aspect, by arranging that the planar spiral discharge coil is partially or wholly of spiral configuration, it is possible to provide the plasma processing apparatus having good matching characteristics.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
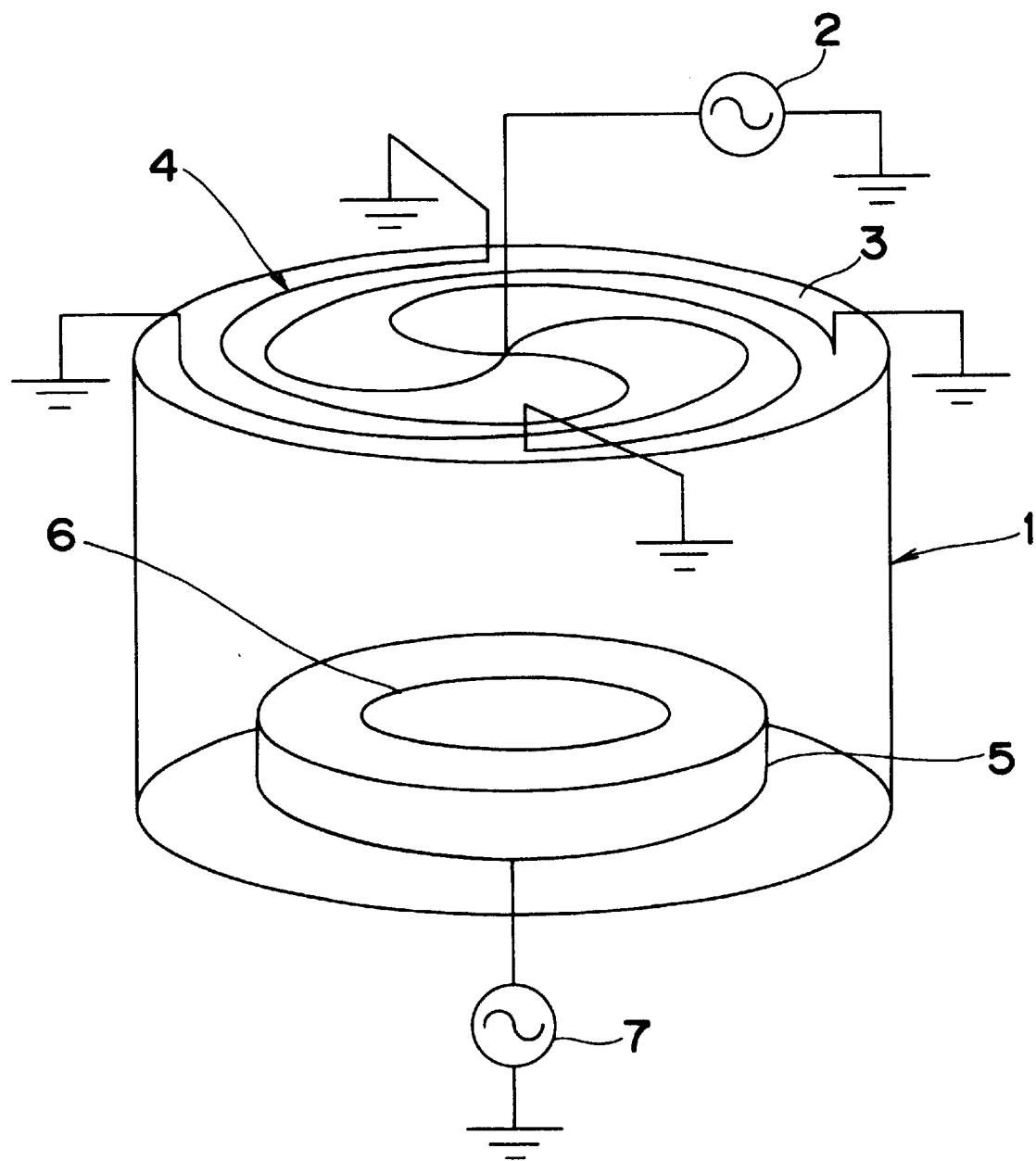
FIG. 1 is a schematic perspective view showing an arrangement of a plasma processing apparatus according to a first embodiment of the present invention.

Before the description of the present invention proceeds, it is to be noted that like parts are designated by like reference numerals throughout the accompanying drawings.

One embodiment of the plasma processing apparatus according to the invention will now be described with reference to FIGS. 1 to 5.

Figure 2A:
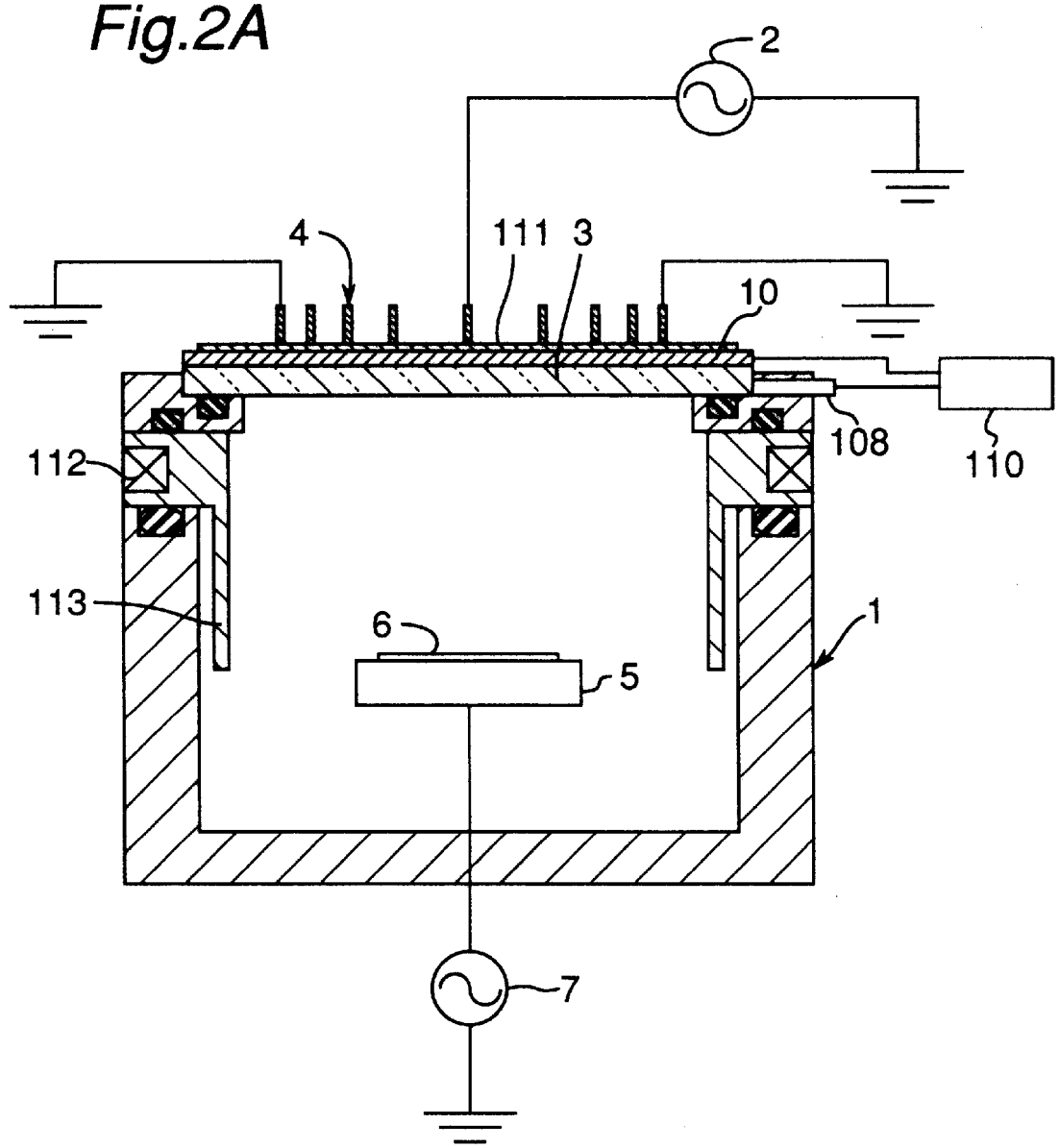
FIG. 2A is a sectional view showing the arrangement of the plasma processing apparatus of the first embodiment.
Figure 2B:
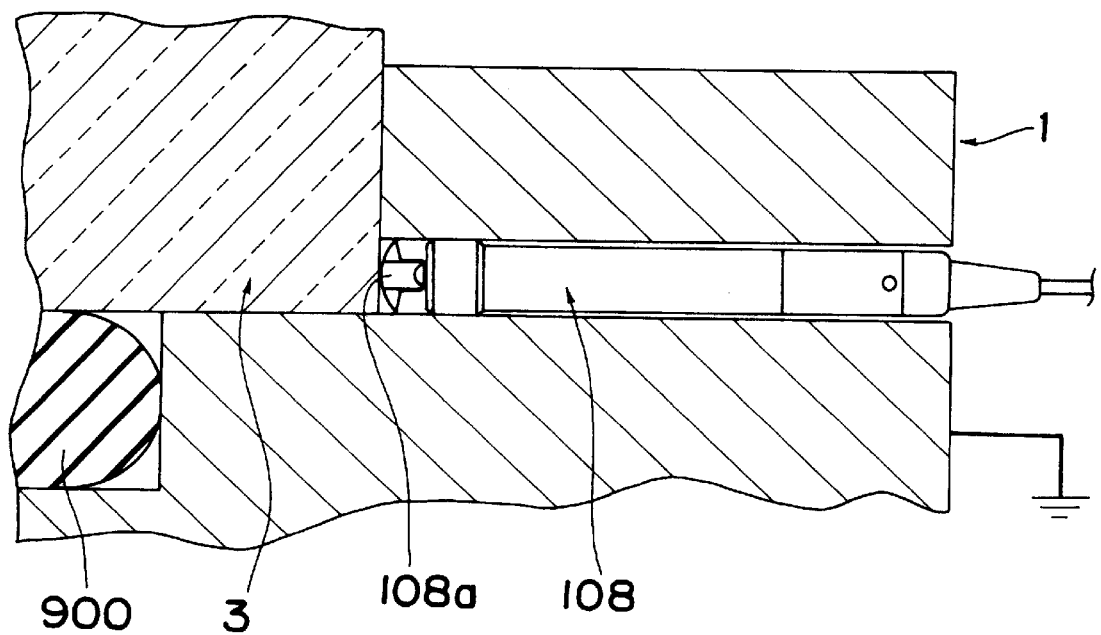
FIG. 2B is a sectional view showing a pressure contact type thermocouple disposed on a side of a dielectric plate in the apparatus.

In FIGS. 1 and 2A, evacuation is performed while a suitable gas is being introduced into a vacuum chamber, e.g. vacuum vessel 1, and a high frequency voltage is applied by a high frequency power source 2 for discharge coil to a planar spiral discharge coil (of multiple spiral form) 4 while the interior of the vacuum vessel 1 is kept under adequate pressure, whereupon plasma is generated within the vacuum vessel 1 to enable plasma treatment operations, such as etching, deposition, and surface modification, to be performed with respect to a substrate 6 placed on an electrode 5. In this case, as FIGS. 1 and 2A show, a high frequency voltage is applied by a high frequency power source 7 for electrode to the electrode 5, whereby ion energies reaching the substrate 6 can be controlled. A pressure contact type thermocouple 108 shown in FIG. 2B and a planar heater 10 which are mounted on a dielectric plate 3 are connected to a heater temperature controller 110 so that the temperature of the dielectric plate 3 may be controlled to any desired temperature. A heat insulator 111 is provided between the planar heater 10 and the planar spiral discharge coil 4 so that the planar spiral discharge coil 4 will not be overheated. The pressure contact type thermocouple 108 has a spring 108a for contacting with the side surface of the dielectric plate 3 under pressure so as to detect the temperature of the dielectric plate 3 as shown in FIG. 2B. Reference numeral 900 denotes an O-ring for sealing between the dielectric plate 3 and the vessel 1. Preferably, conductors of the heater 10 are generally uniformly arranged in the whole area thereof. That is, where n is any real number and S is the whole area of the heater 10, the conductors of the heater 10 is generally uniformly arranged at each divided area S/n.

Figure 3:
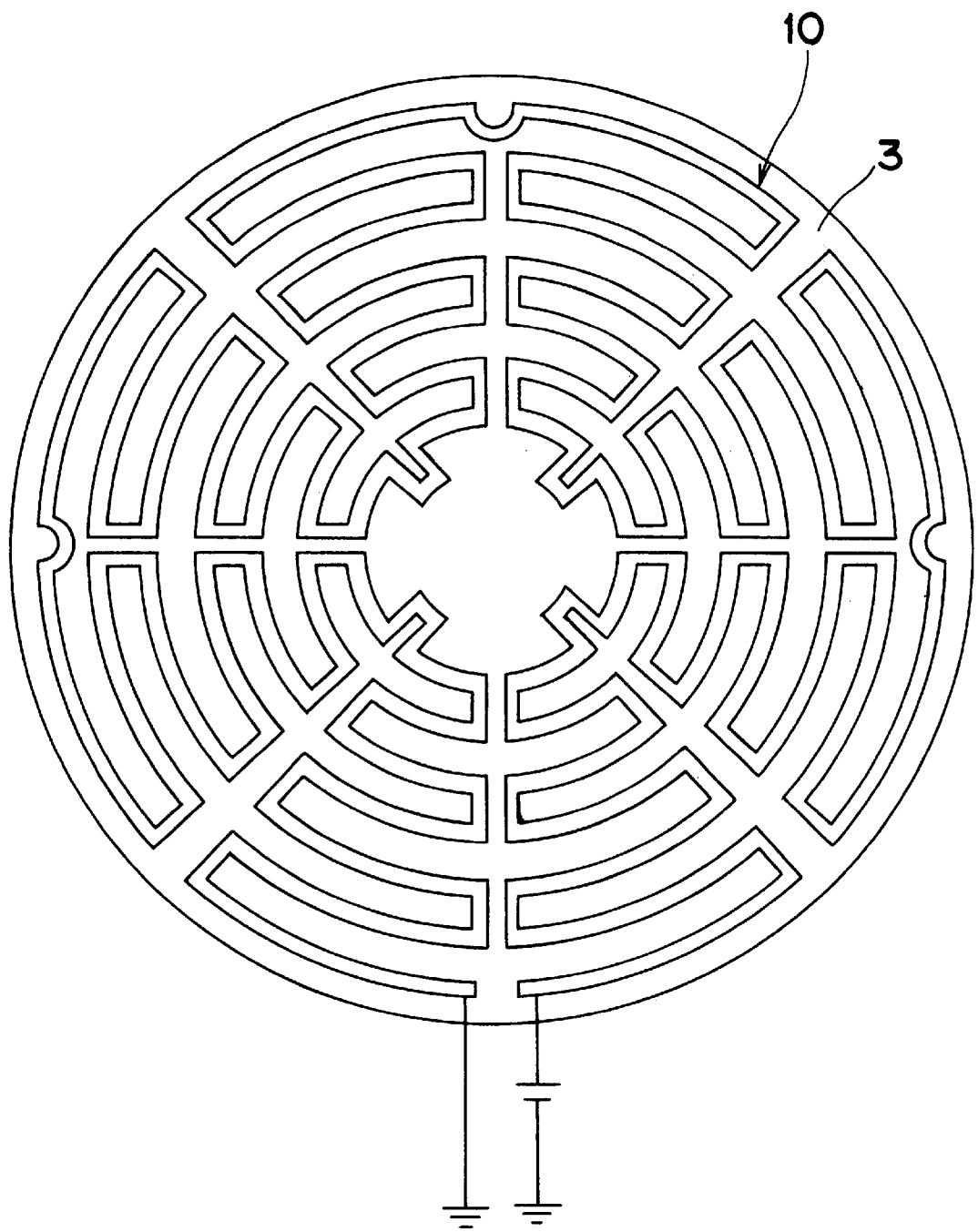
FIG. 3 is a plan view of a planar heater in the plasma processing apparatus of the first embodiment.

The planar heater 10, as shown in FIG. 3, is so configured as to satisfy the relation:

$$Sh < Sy \times 0.4$$

where Sh represents the area of the planar heater 10 and Sy represents the area of the dielectric plate 3.

Further, as FIG. 2A shows, an inner chamber 113, equipped with a belt heater 112 is provided so that almost all parts coming into contact with plasma, including the dielectric plate 3, can be heated.

With the temperature of the dielectric plate 3 varied from 25° C. and up to 200° C., substrate 6 with silicon oxide film was subjected to etching for 5 minutes under conditions such that the kind of gas and flow rate thereof, pressure, high frequency power applied to planar spiral discharge coil, and high frequency power applied to electrode were respectively set at $C_4F_8/H_2$=50/15 sccm, 10 mTorr, 1000 W, and 300 W. Measurement results with respect to thickness of films deposited on dielectric plate 3, and silicon oxide film/polysilicon etching select ratio are shown in FIGS. 4 and 5.

Figure 4:
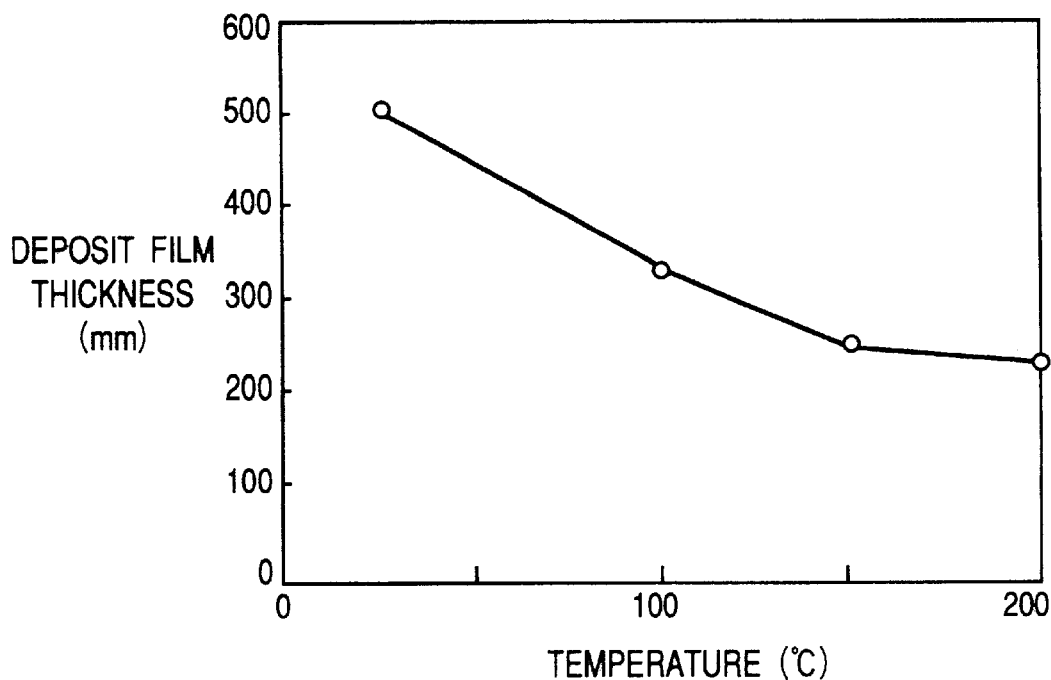
FIG. 4 is a graph showing measurement results for thickness of films deposited on a dielectric plate of the first embodiment.
Figure 5:
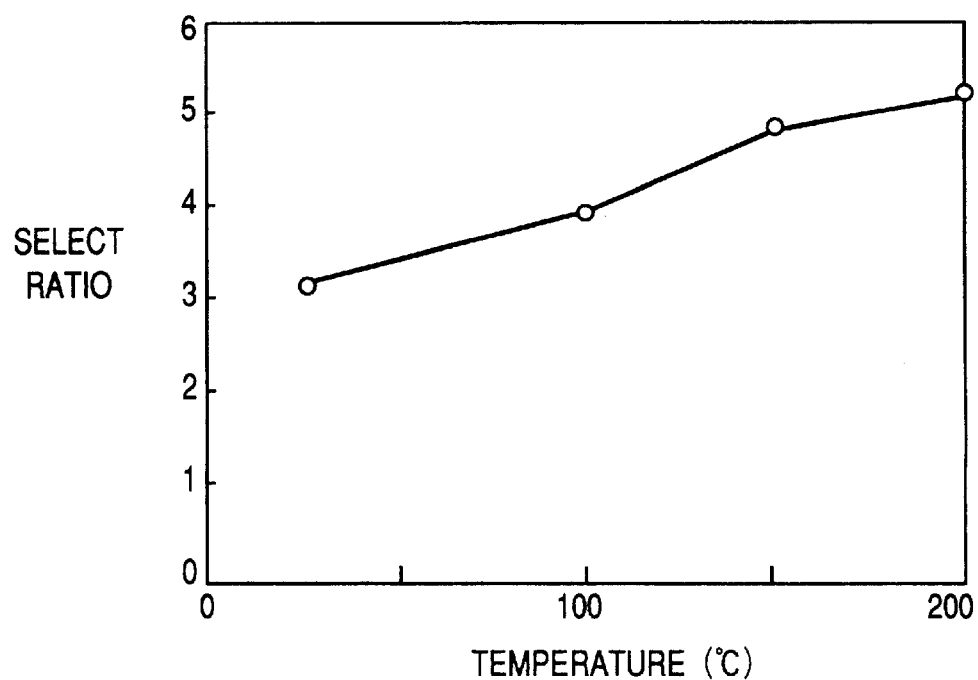
FIG. 5 is a graph showing measurement results for silicon oxide film/polysilicon etching select ratio.

It can be seen from FIG. 4 that the higher the temperature of the dielectric plate 3, the smaller is the thickness of thin film depositing on the dielectric plate 3. Further, it can be seen from FIG. 5 that when the dielectric plate 3 is heated to 150° C. or more, a higher silicon oxide film/polysilicon etching select ratio can be obtained.

A large number of substrates with silicon oxide film deposited thereon were subjected to etching under the same etching conditions as above noted. In the case of there being no provision of planar heater 10, as cycles of processing were repeated one after another, the temperature of dielectric plate 3 gradually increased, whereas in the case where there was provided a planar heater 10 and that the temperature was set at 80° C. or more, even with cycles of processing repeated one after another, the temperature of the dielectric plate 3 varied only within a range of ±15° C., being thus kept satisfactorily stable. In the case where planar heater 10 was not provided, dust began to fall a lot on the substrate when 15 pieces of substrate had been processed, whereas when a planar heater 10 was provided, with the temperature of the dielectric plate 3 set at 80° C. or more, there was little dust falling, if any, on the substrate even after 100 substrates were processed. In the case of there being no provision of planar heater 10, an etching rate reproducibility of ±8% was witnessed with respect to a continuously processed series of 15 sheets, whereas in the case that a planar heater 10 was provided, with a temperature setting of 80° C. made for the dielectric plate 3, etching rate reproducibility was as good as ±2%. Etching rate reproducibility was calculated according to the relation:

$$((V_{max} - V_{min})/V_{ave}) \times 50$$

where, $V_{max}$ is maximum etching rate value; $V_{min}$ is minimum etching rate value; and $V_{ave}$ is average etching rate value.

In the foregoing embodiment, the dielectric plate 3 is circular in shape. However, the dielectric plate 3 may be even rectangular in shape, in which case the planar heater 10 may be so configured as to satisfy the relation:

$$Sh < Sy \times 0.4$$

where, Sh is the area of the planar heater 10; and Sy is the area of the dielectric plate 3.

Where this relation holds, the high frequency magnetic field due to the planar spiral discharge coil 4 is formed within the vacuum vessel 1 without being interrupted by the planar heater 10. Therefore, electric discharge can be maintained. It has been found that if the relation is not satisfied, electric discharge may be unstable; some reflected high frequency power may be produced; and in some extreme case, electric discharge cannot be maintained.

In the description of the foregoing embodiment it has been stated that when the dielectric plate 3 is heated to 150° C. or more, high silicon oxide film/polysilicon etching select ratio can be obtained. It is needless to say, however, that in the case of silicon nitride film etching as well, high etching select ratio can be obtained relative to polysilicon etching.

Figure 6:
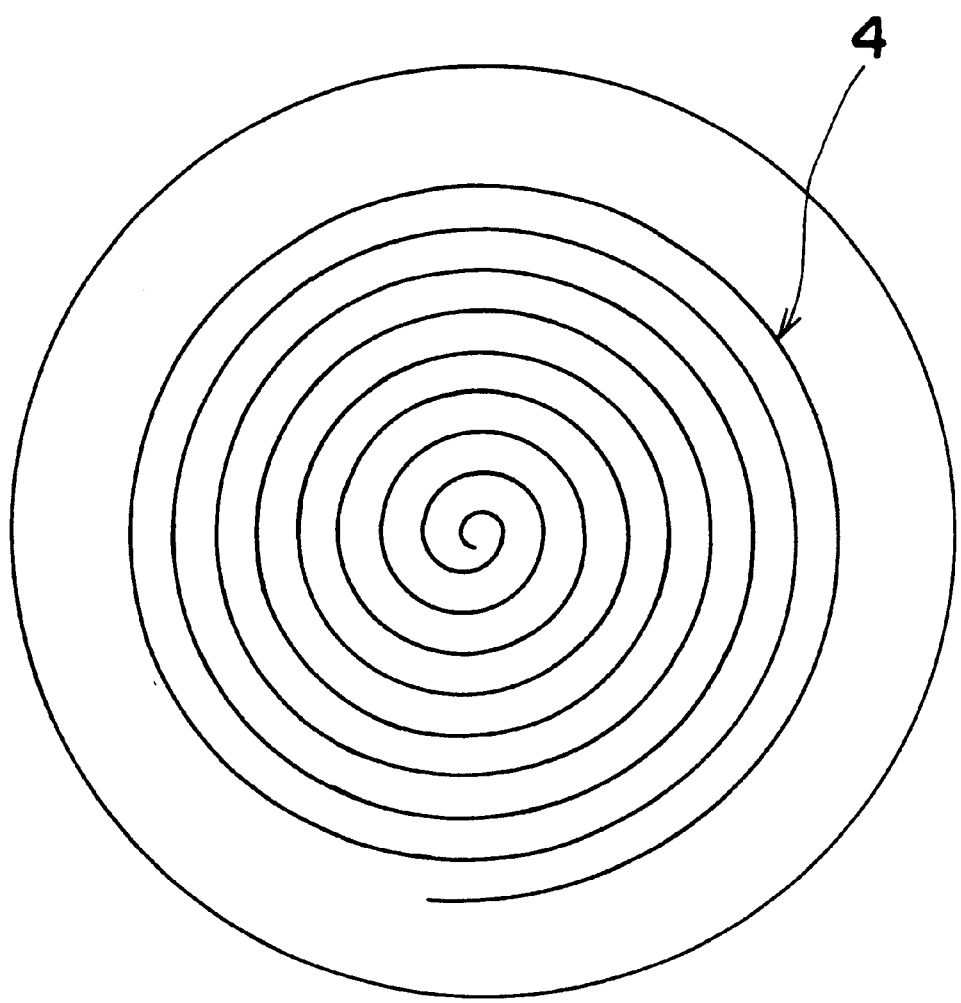
FIG. 6 is a plan view of a planar spiral discharge coil in a second embodiment of the present invention.

In the above described embodiment, for the planar spiral discharge coil is used a multiple spiral coil of low inductance. Alternatively, however, the planar spiral discharge coil 4 may be such a simple spiral coil as shown in FIG. 6.

Figure 7A:
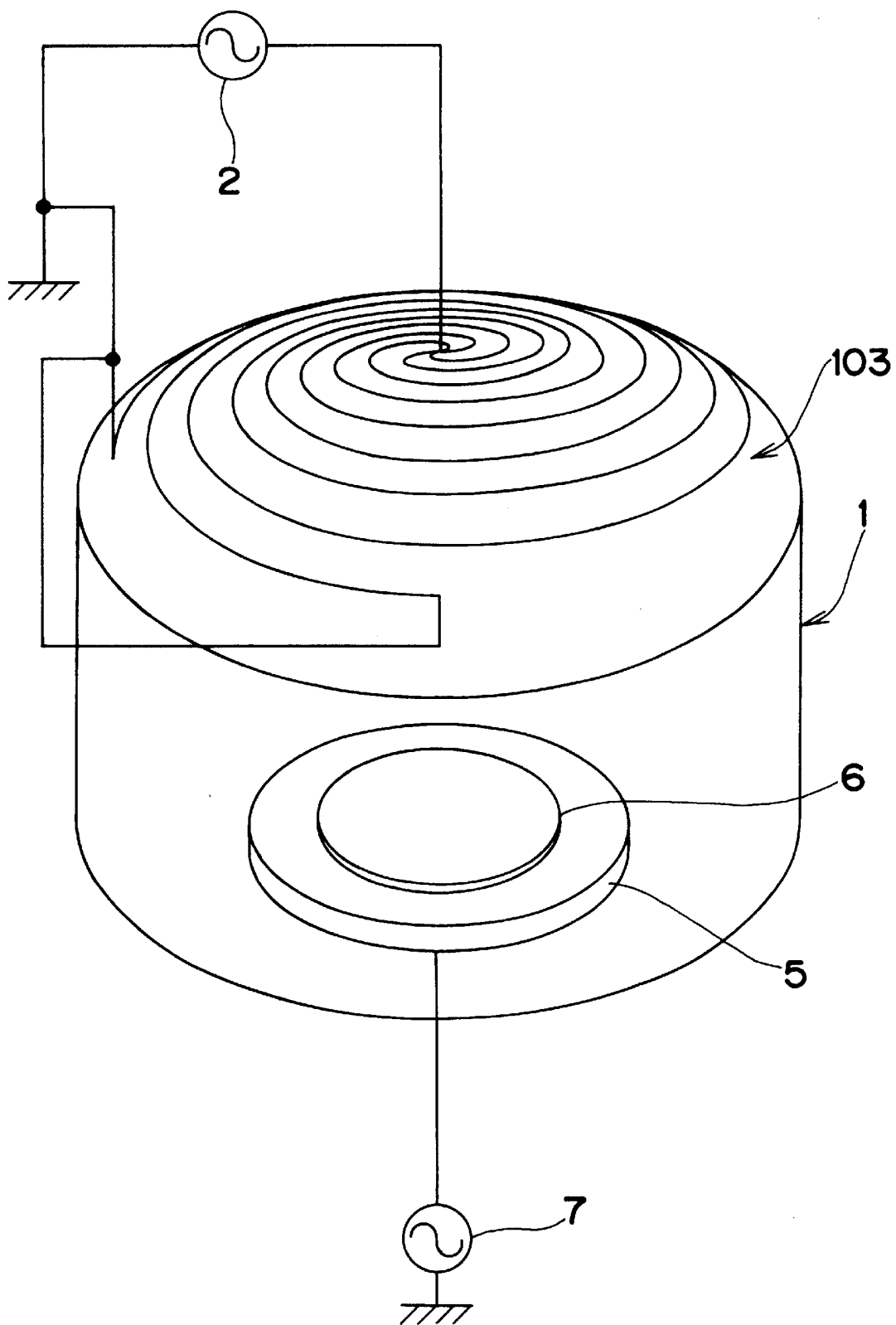
FIG. 7A is a structural diagram of a plasma processing apparatus according to a third embodiment of the present invention.
Figure 7B:
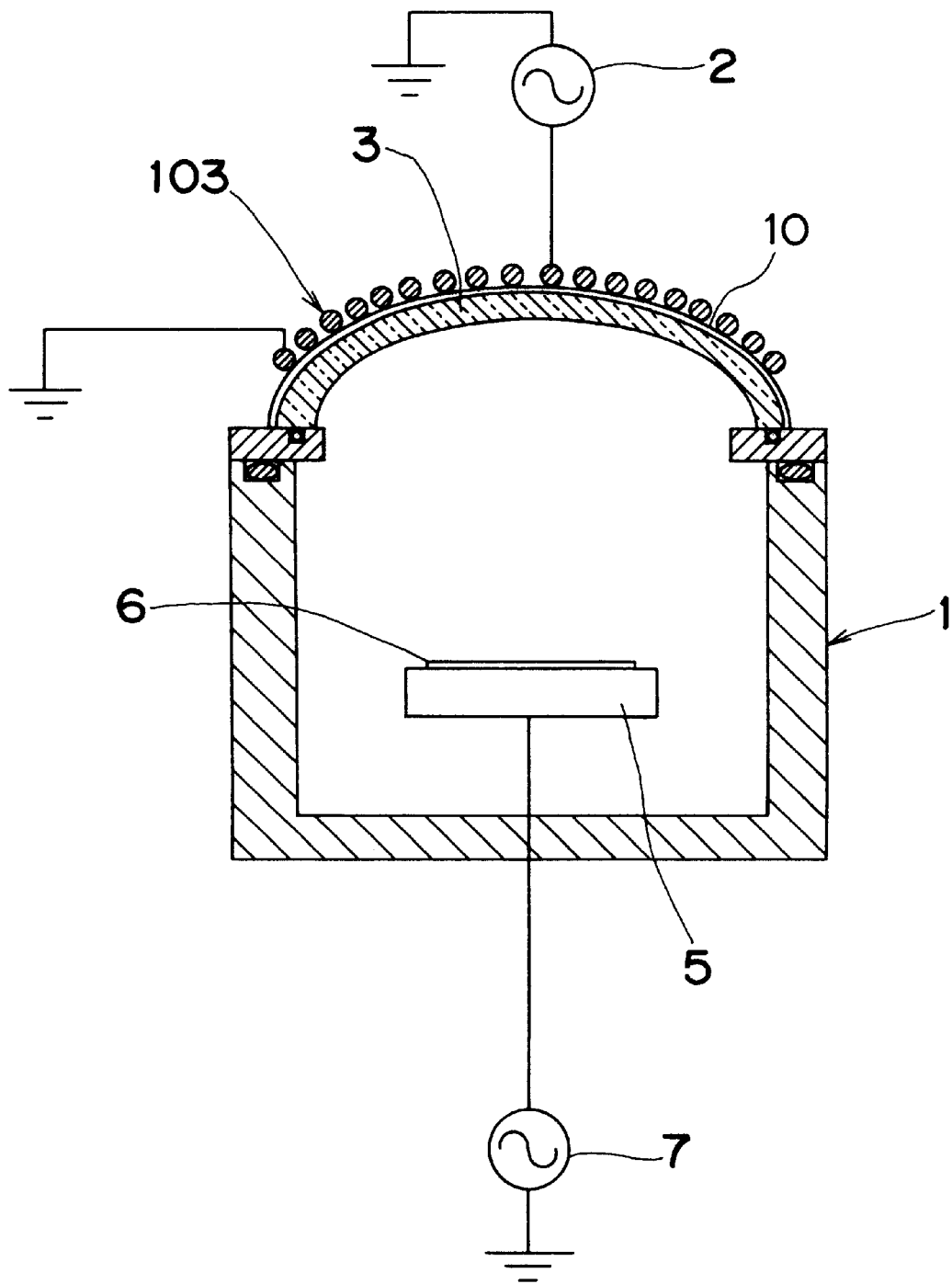
FIG. 7B is a sectional view of the apparatus in FIG. 7A.
Figure 8:
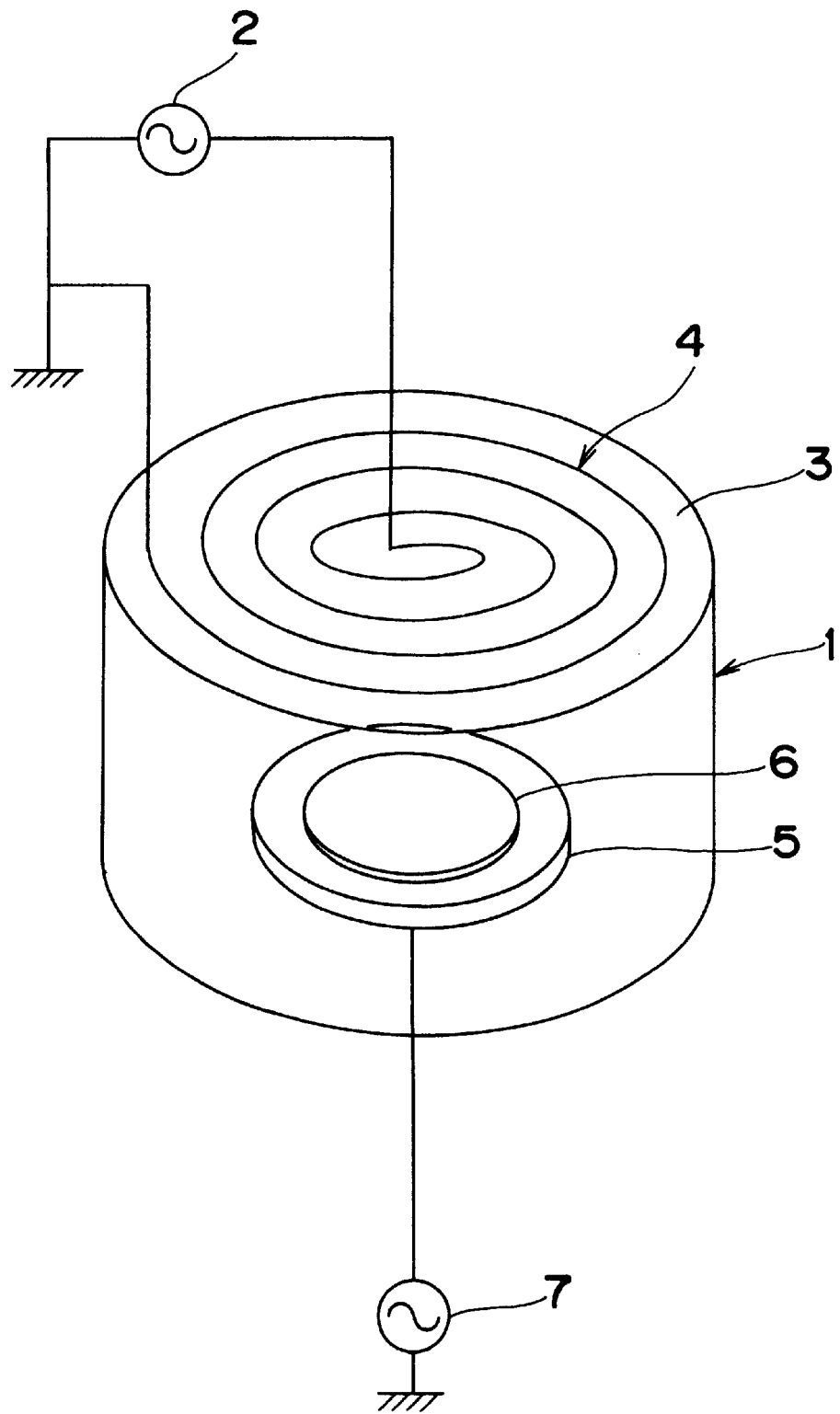
FIG. 8 is a perspective view showing a schematic arrangement of a conventional plasma processing apparatus.

Furthermore, as shown in FIGS. 7A and 7B, a discharge coil 103 may have a bell-shaped configuration in three dimensions.

While in the above described mode, etching of silicon oxide film and silicon nitride film is taken up by way of example, the present invention may also be applicable to the etching of aluminum alloy, polysilicon, polycide and the like, as well as to the depositing (CVD) of silicon oxide film, silicon nitride film and the like.

As is apparent from the foregoing description, in the plasma processing method and apparatus of the present invention, the dielectric plate is heated by a heating device to 80° C. or more. By so doing it is possible to substantially reduce the thickness of a thin film to be deposited on the dielectric plate as compared with the case in which no such heating is carried out, and to inhibit dust generation since the film is more dense in quality than in the case where a lower temperature is used. Thus, the frequency of maintenance required with respect to the dielectric plate can be noticeably decreased. When processing cycles are repeated one after another, changes, if any, in the thickness of films deposited are insignificant, and the rate of radical adsorption will remain low without any appreciable change, because the temperature of the dielectric plate is kept high. Therefore, the atmosphere within the vacuum vessel, that is, partial pressure of reaction species, is kept stable, and this enables effective plasma processing with good reproducibility.

In the case of plasma processing for silicon oxide film etching or silicon nitride film etching, the dielectric plate is heated to 150° C. or more, and this provides, in addition to the above mentioned advantage, a further advantage that adsorption of CF-based radicals, such as CF and $CF_2$. on the dielectric plate is noticeably decreased so that deposition of CF-based polymers on a substrate polysilicon is enhanced, resulting in improved select ratio of silicon oxide film or silicon nitride film/polysilicon for etching.

Where the device for heating the dielectric plate includes a planar heater, the heating arrangement for the dielectric plate is very much simplified. Assuming that the area of the planar heater is Sh and the area of the dielectric plate is Sy, if the relation Sh<Sy×0.4 is satisfied, a high frequency magnetic field due to the planar spiral discharge coil is produced within the vacuum vessel without being interrupted by the planar resistance heater. Thus, electric discharge can be well maintained.

Preferably, the planar spiral discharge coil is partially or wholly of a multiple spiral shape so that the planar spiral discharge coil can be of low inductance.

The temperature of the dielectric plate can be maintained at a high level through temperature control of the dielectric plate while the temperature of the dielectric plate is being monitored. Thus, adsorption of radicals on the dielectric plate remains low without any substantial change. Therefore, the atmosphere within the vacuum vessel, that is, partial pressure of reaction species is kept stable and thus plasma processing can be carried out with good reproducibility.

By controlling the temperature of the dielectric plate through monitoring by means of a pressure contact type thermocouple mounted to a side of the dielectric plate, it is possible to reduce the effect of high frequency noise and, thus, temperature control can be performed with less possibility of a malfunction. This, coupled with the fact that the pressure contact type thermocouple has good thermal responsiveness, enables temperature control to be accurately performed.

A fourth embodiment of the plasma processing apparatus according to the invention will now be described with reference to FIGS. 9 and 10.

Figure 9:
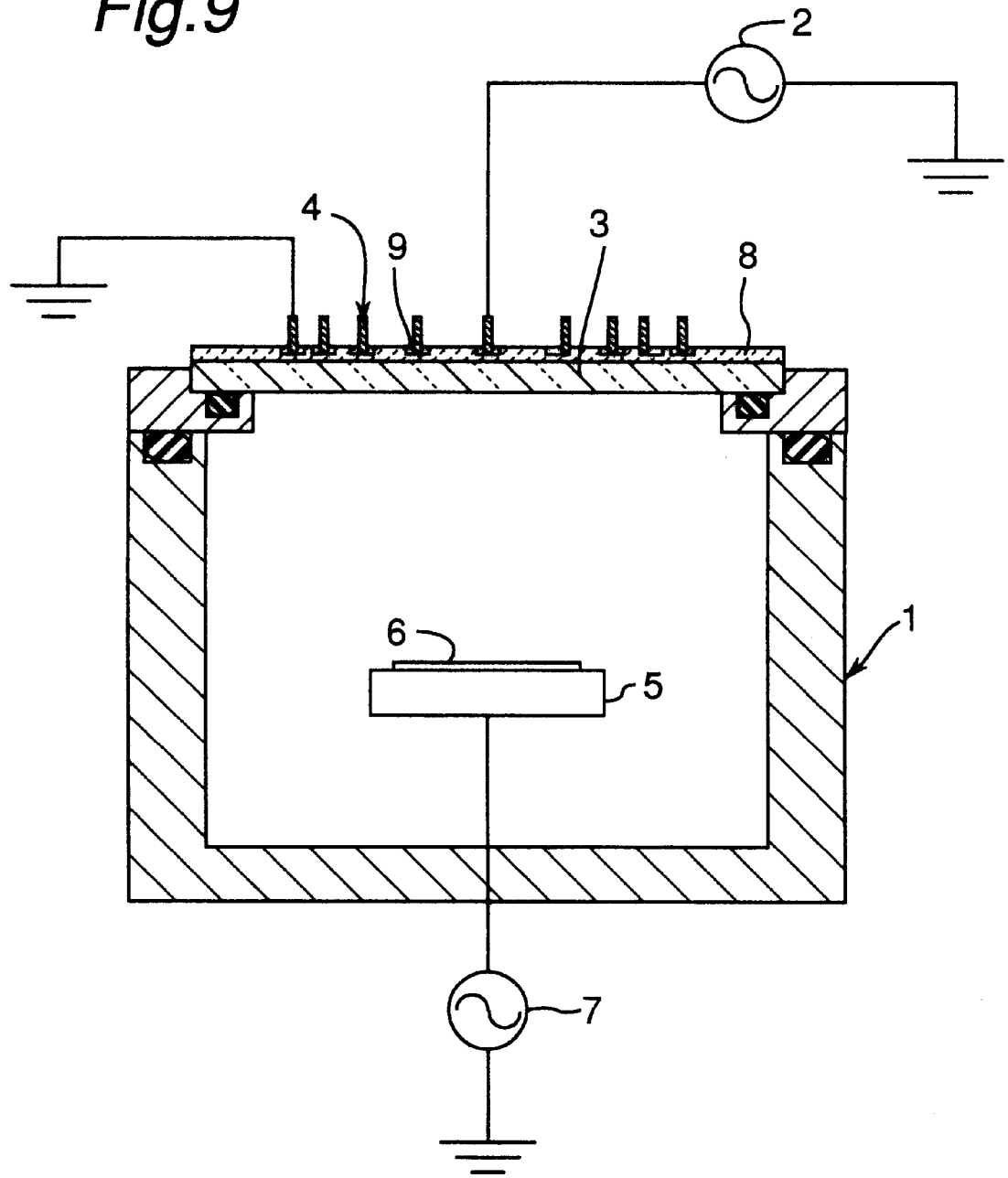
FIG. 9 is a sectional view showing an arrangement of a plasma processing apparatus representing a fourth embodiment of the present invention.

In FIG. 9, a vacuum vessel 1 is evacuated while a suitable gas is introduced thereinto and, with the interior of the vacuum vessel 1 being kept under a suitable pressure, a high frequency voltage is applied by a high frequency discharge coil power source 2 to a planar spiral discharge coil 4 mounted on a ceramic (alumina) plate 8 having a thickness of 5 mm which is formed with a discharge coil fixing groove 9, whereupon plasma is generated within the vacuum vessel 1 to enable plasma processing, such as etching, deposition, or surface modification, to be applied to a substrate 6 placed on an electrode 5. The lower part of the spiral discharge coil 4 is inserted into the fixing groove 9 so as to be capable of moving the coil 4 therein. As one example, the depth and width of the groove 9 are 2–3 mm and 0.5–0.6 mm, and the width of the coil 4 is 0.2 mm. In this case, a high frequency voltage is applied to the electrode 5 by a high frequency electrode power source 7 as shown in FIG. 9, whereby ion energies reaching the substrate 6 can be controlled. It is noted that reference numeral 3 designates a dielectric plate.

A plurality of substrates 6, each with a 500 nm thick silicon oxide film deposited thereon, were etched in succession under work conditions such that gas species and flow rate thereof, pressure, high frequency power applied to discharge coil of planar thin type, and high frequency power applied to electrode are respectively set at $C_4F_8/H_2$=50/15 sccm, 10 mTorr, 1000 W, and 300 W. The temperature of the dielectric plate 3 tended to rise due to heating by high energy ions impinging upon the dielectric plate 3, and at the tenth one of the substrates, the temperature of the dielectric plate 3 reached 200° C. However, the engagement between the discharge coil 4 and the ceramic plate 8 was in no way damaged. There was no deformation either of the discharge coil 4. Expansion of the discharge coil 4 occurred due to temperature rise, but there was no breakage of the ceramic plate 8, because such expansion of the coil 4 is absorbed by movement of the coil 4 in the groove 9.

In the above described fourth embodiment, alumina is used as the material for the ceramic plate 8. As an alternative, zirconia or the like may be used. In particular, it has been found that as long as the area of the ceramic plate 8 is 350 cm² or less, no cracks occur with the ceramic plate 8 even if the ceramic plate 8 is comprised of a less expensive free-cutting ceramic and is 5 mm thick or less. Therefore, where the area of the ceramic plate 8 is 350 cm² or less, it is possible to provide a plasma processing apparatus which is less expensive and has good power efficiency by using a free-cutting ceramic material for the ceramic plate 8.

Figure 10:
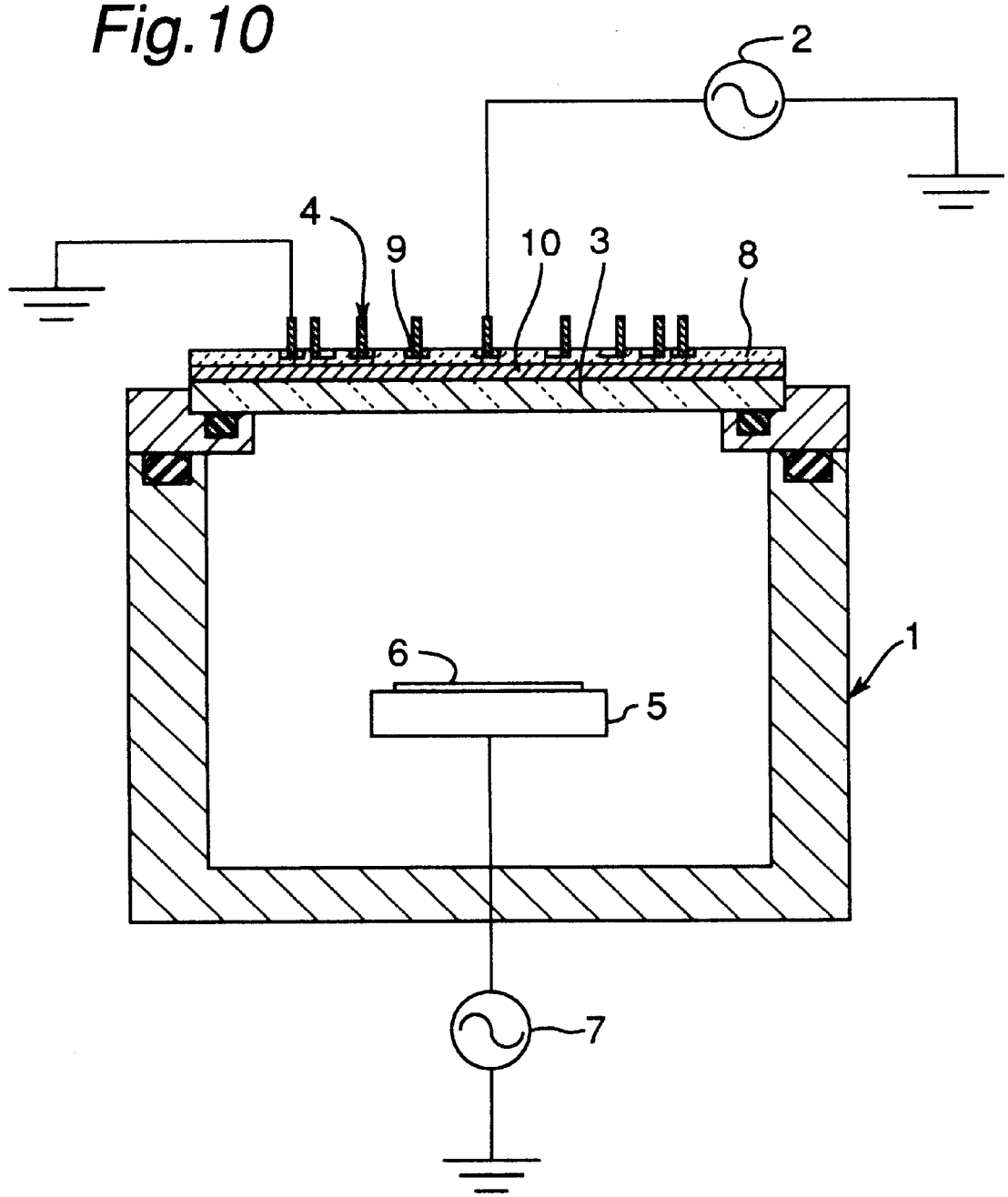
FIG. 10 is a sectional view showing a modified form of the plasma processing apparatus of the fourth embodiment.

A planar heater 10 may be disposed between the ceramic plate 8 and the dielectric plate 3 as shown in FIG. 10. By so doing, it is possible to stabilize the temperature of the dielectric plate 3, prevent dust generation, enlarge maintenance cycles, and improve reproducibility.

As examples of generally well known free-cutting ceramics many be mentioned "MACERITE" of Mitsui Kozan Material Co., and "Photoveel" of Sumikin Photon Ceramic Co.

Next, a fifth embodiment of the plasma processing apparatus of the present invention will be described with reference to FIGS. 11 and 12.

Figure 11:
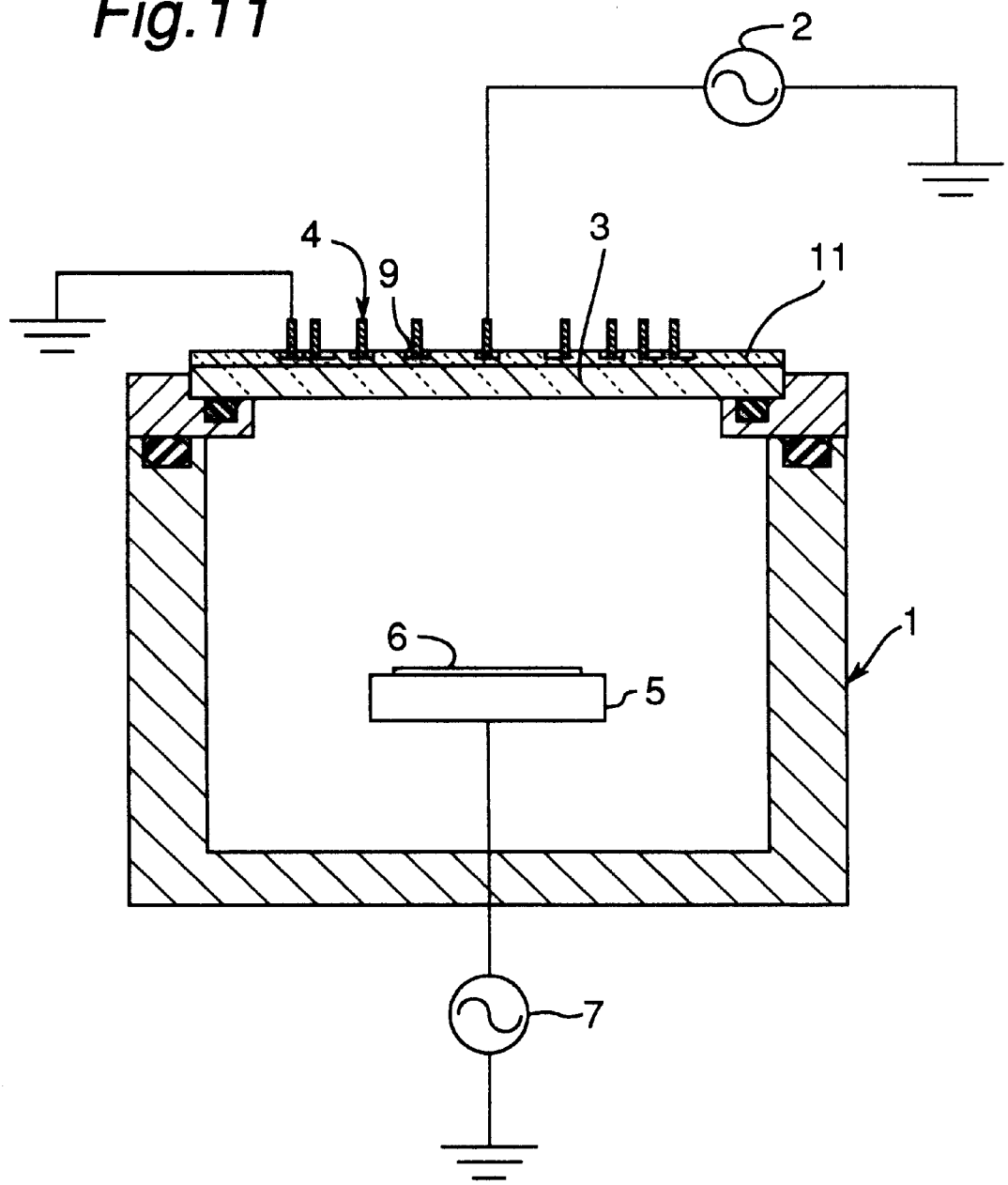
FIG. 11 is a sectional view showing the arrangement of a plasma processing apparatus according to a fifth embodiment of the present invention.
Figure 12:
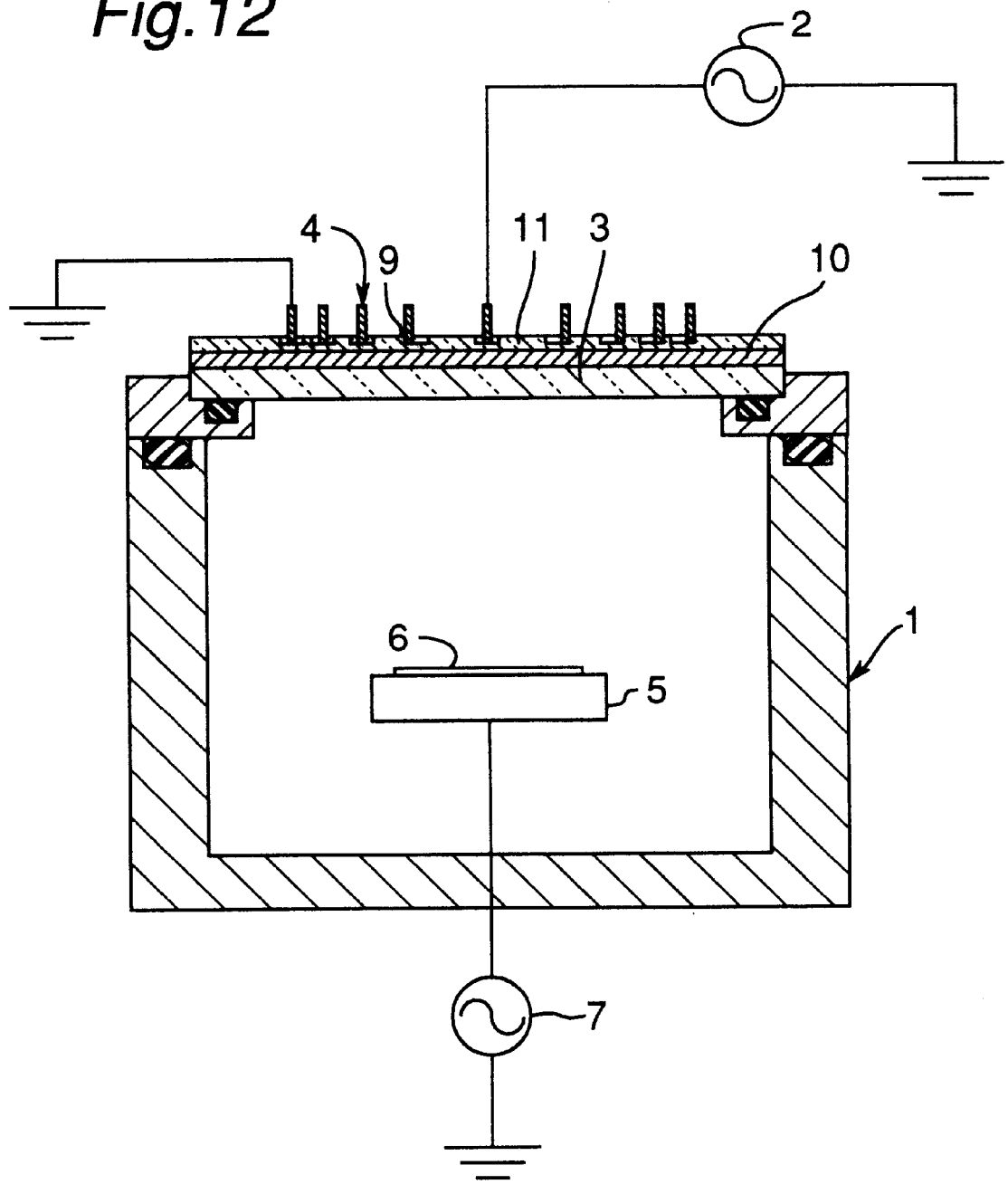
FIG. 12 is a sectional view showing a modified form of the plasma processing apparatus of the fifth embodiment.

In FIG. 11, a vacuum vessel 1 is evacuated while a suitable gas is introduced thereinto and, with the interior of the vacuum vessel 1 being kept under a suitable pressure, a high frequency voltage is applied by a high frequency discharge coil power source 2 to a planar spiral discharge coil 4 mounted on a glass plate 11 having a thickness of 5 mm which is formed with a discharge coil fixing groove 9, whereupon plasma is generated within the vacuum vessel 1 to enable a plasma processing, such as etching, deposition, or surface modification, to be given to a substrate 6 placed on an electrode 5. The lower part of the spiral discharge coil 4 is inserted into the fixing groove 9 so as to be capable of moving the coil 4 therein. In this case, a high frequency voltage is applied to the electrode 5 by a high frequency electrode power source 7 as shown in FIG. 11, whereby ion energies reaching the substrate 6 can be controlled. It is noted that reference numeral 3 designates a dielectric plate.

A plurality of substrates 6, each with a 500 nm thick silicon oxide film deposited thereon, were etched in succession under work conditions such that gas species and flow rate thereof, pressure, high frequency power applied to discharge coil of planar thin type, and high frequency power applied to electrode are respectively set at $C_4F_8/H_2$=50/15 sccm, 10 mTorr, 1000 W, and 300 W. The temperature of the dielectric plate 3 tended to rise due to heating by high energy ions impinging upon the dielectric plate 3, and at the tenth one of the substrates the temperature of the dielectric plate 3 reached 200° C. However, the engagement between the discharge coil 4 and the glass plate 11 was in no way damaged. There was no deformation either of the discharge coil 4. Expansion of the discharge coil 4 occurred due to temperature rise, but there was no breakage of the glass plate 11, because such expansion of the coil 4 is absorbed by moving the coil 4 in the groove 9.

In the above described fifth embodiment, the glass plate 11 is disposed in contact with the dielectric plate 3. However, a planar heater 10 may be disposed between the glass plate 11 and the dielectric plate 3 as shown in FIG. 12. By so doing it is possible to stabilize the temperature of the dielectric plate 3, prevent dust generation, enlarge maintenance cycles, and improve reproducibility.

Next, a sixth embodiment of the plasma processing apparatus of the invention will be described with reference to FIGS. 13 to 15.

Figure 13:
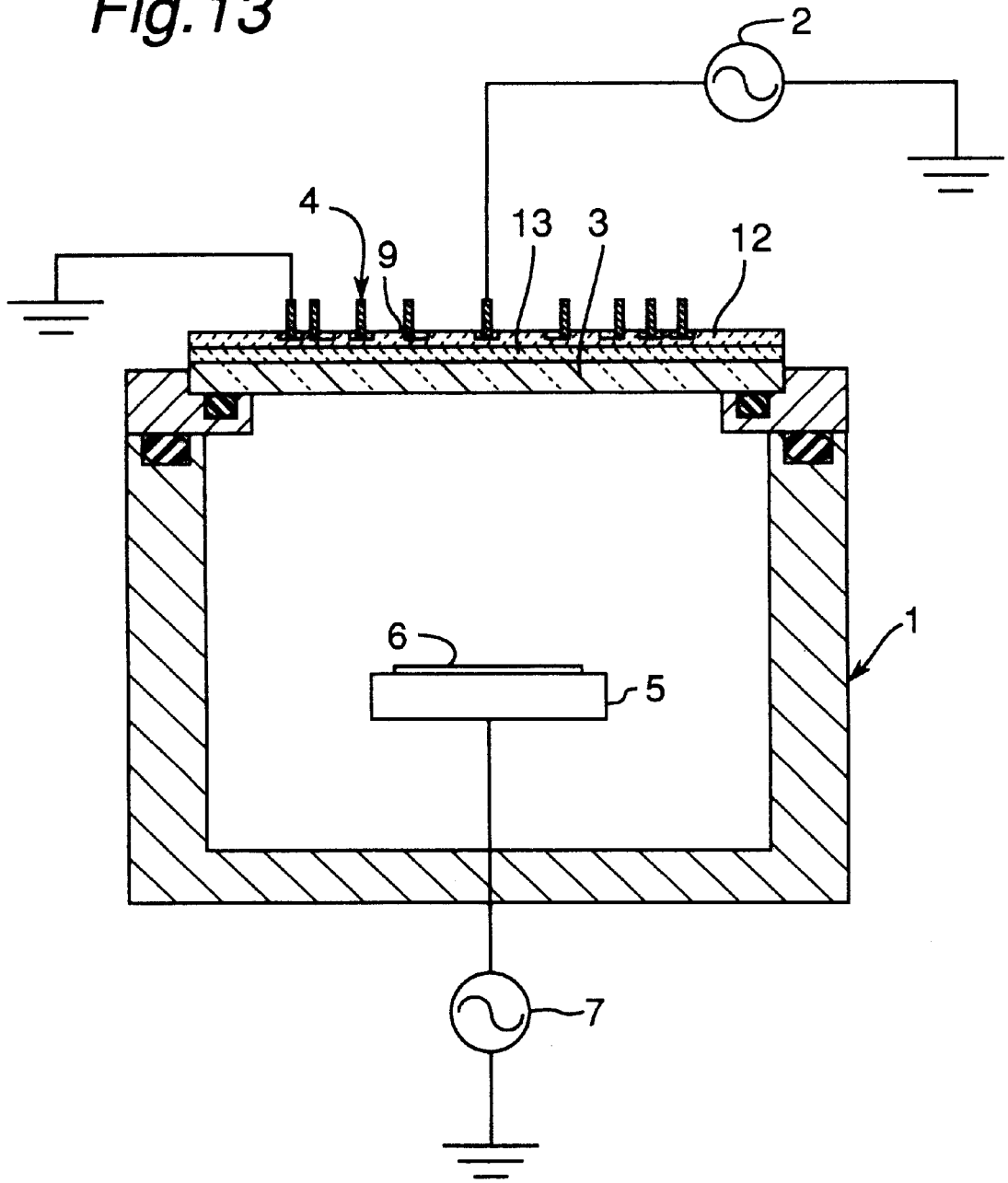
FIG. 13 is a sectional view showing the arrangement of a plasma processing apparatus according to a sixth embodiment of the present invention.
Figure 14:
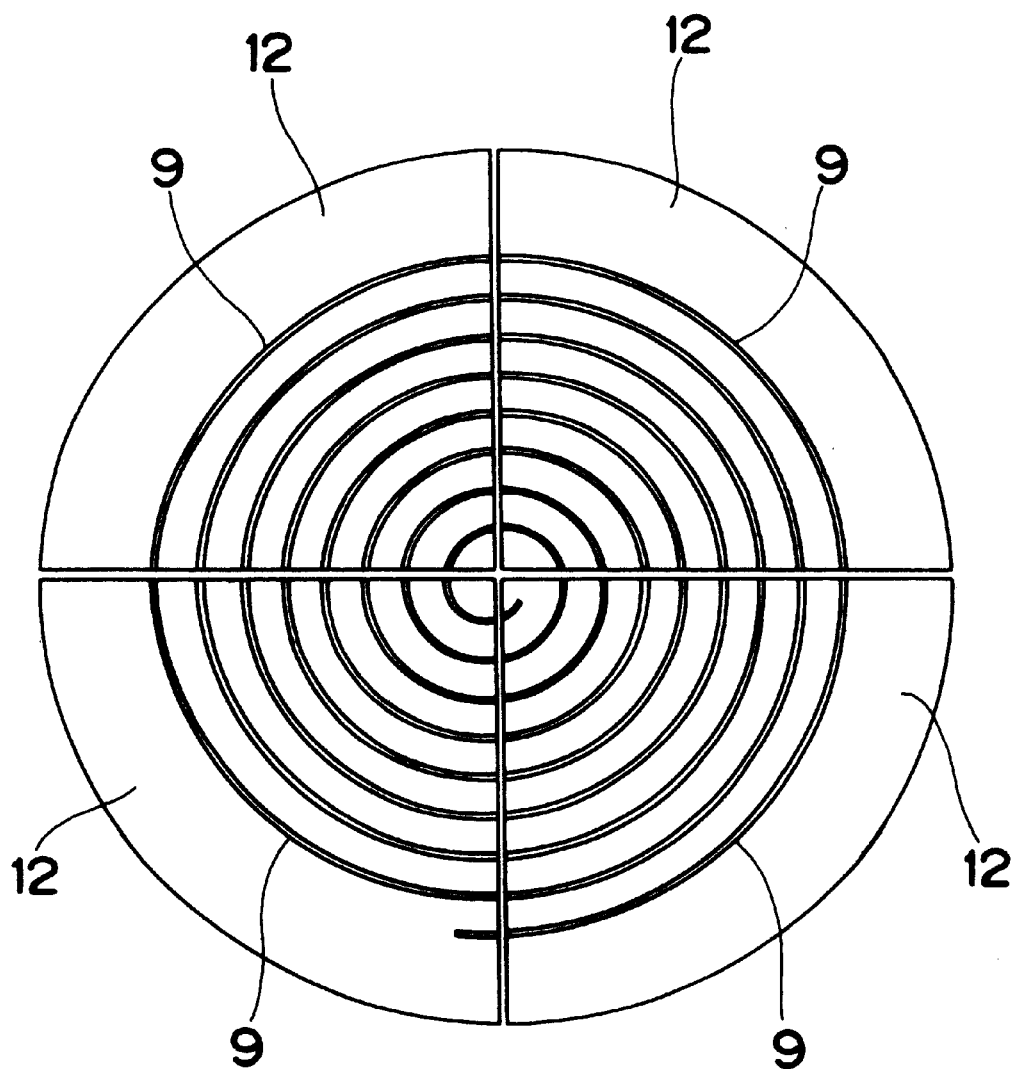
FIG. 14 is a plan view showing the configuration of a free-cutting ceramic plate in the plasma processing apparatus of the sixth embodiment.

In FIG. 13, a vacuum vessel 1 is evacuated while a suitable gas is introduced thereinto and, with the interior of the vacuum vessel 1 being kept under a suitable pressure, a high frequency voltage is applied by a high frequency discharge coil power source 2 to a planar spiral discharge coil 4 mounted on free-cutting ceramic plate 12 having a thickness of 5 mm which is formed with discharge coil fixing grooves 9, whereupon plasma is generated within the vacuum vessel 1 to enable plasma processing, such as etching, deposition, or surface modification, to be applied to a substrate 6 placed on an electrode 5. The lower part of the spiral discharge coil 4 is inserted into the fixing grooves 9 so as to be capable of accommodating movement of the coil 4 therein. In this case, a high frequency voltage is applied to the electrode 5 by a high frequency electrode power source 7 as shown in FIG. 13, whereby ion energies reaching the substrate 6 can be controlled. It is noted that reference numeral 3 designates a dielectric plate. It is noted that the free-cutting ceramic plate 12 is divided into four parts as shown in FIG. 14, respective divisional parts of the free-cutting ceramic plate being each 350 cm$^2$ or less in area. Further, a glass plate or ceramic plate 13 is provided between the free-cutting ceramic plate 12 and the dielectric plate 3.

A plurality of substrates 6, each with a 500 nm thick silicon oxide film deposited thereon, were etched in succession under work conditions such that gas species and flow rate thereof, pressure, high frequency power applied to discharge coil of planar thin type, and high frequency power applied to electrode are respectively set at $C_4F_8/H_2$=50/15 sccm, 10 mTorr, 1000 W, and 300 W. The temperature of the dielectric plate 3 tended to rise due to heating by high energy ions impinging upon the dielectric plate 3, and at the tenth one of the substrates, the temperature of the dielectric plate 3 reached 200° C. However, the engagement between the discharge coil 4 and the free-cutting ceramic plate 12 was not damaged in any way. There was also no deformation of the discharge coil 4. Expansion of the discharge coil 4 occurred due to temperature rise, but nevertheless there was no breakage of the free-cutting ceramic plate 12, because such expansion of the coil 4 is absorbed by moving the coil 4 in the groove 9. Further, by virtue of the glass plate or ceramic plate 13 provided between the free-cutting ceramic plate 12 and the dielectric plate 3, there was no occurrence of abnormal electric discharge in the atmosphere despite the fact that the free-cutting ceramic plate 12 was divided into parts.

It has been found that if the area of the free-cutting ceramic plate is larger than 350 cm$^2$, cracks are likely to occur with the free-cutting ceramic plate, and that as long as the area of the free-cutting ceramic plate is not more than 350 cm$^2$, the free-cutting ceramic plate is not liable to crack even if the thickness thereof is 5 mm or less. Therefore, by arranging that individual divisional parts of the divided free-cutting ceramic plate are each not more than 350 cm$^2$, it is possible to prevent each such part from cracking and thus provide a plasma processing apparatus which is less expensive and can exhibit good power efficiency. Further, as shown in FIG. 15, a planar heater 10 may be provided between the glass plate or ceramic plate 13 and the dielectric plate 3. In this case, it is possible to stabilize the temperature of the dielectric plate 3, prevent dust generation, enlarge maintenance cycles, and enhance reproducibility.

Figure 16:
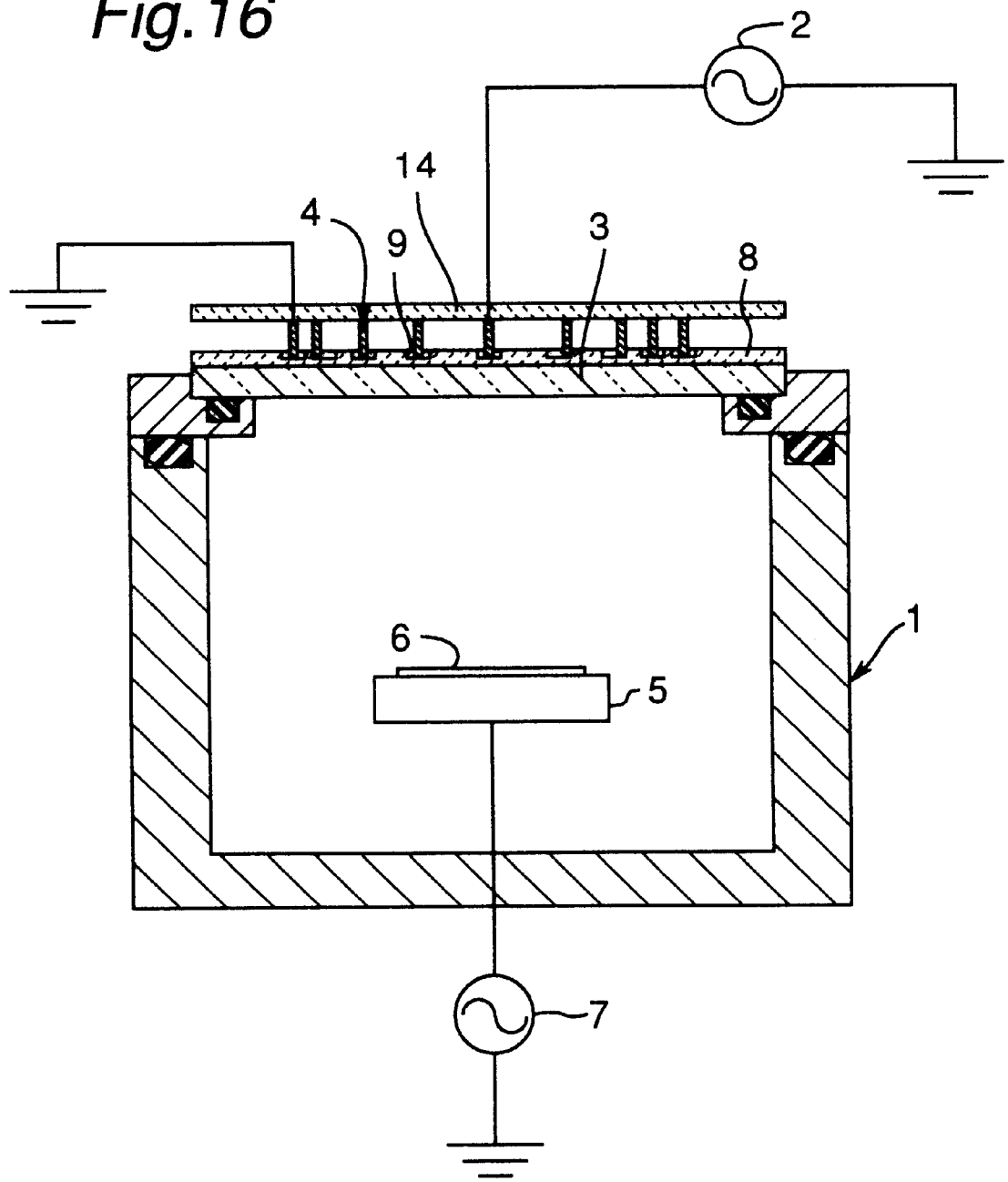
FIG. 16 is a sectional view showing an arrangement of a plasma processing apparatus according to a seventh embodiment of the present invention.
Figure 17:
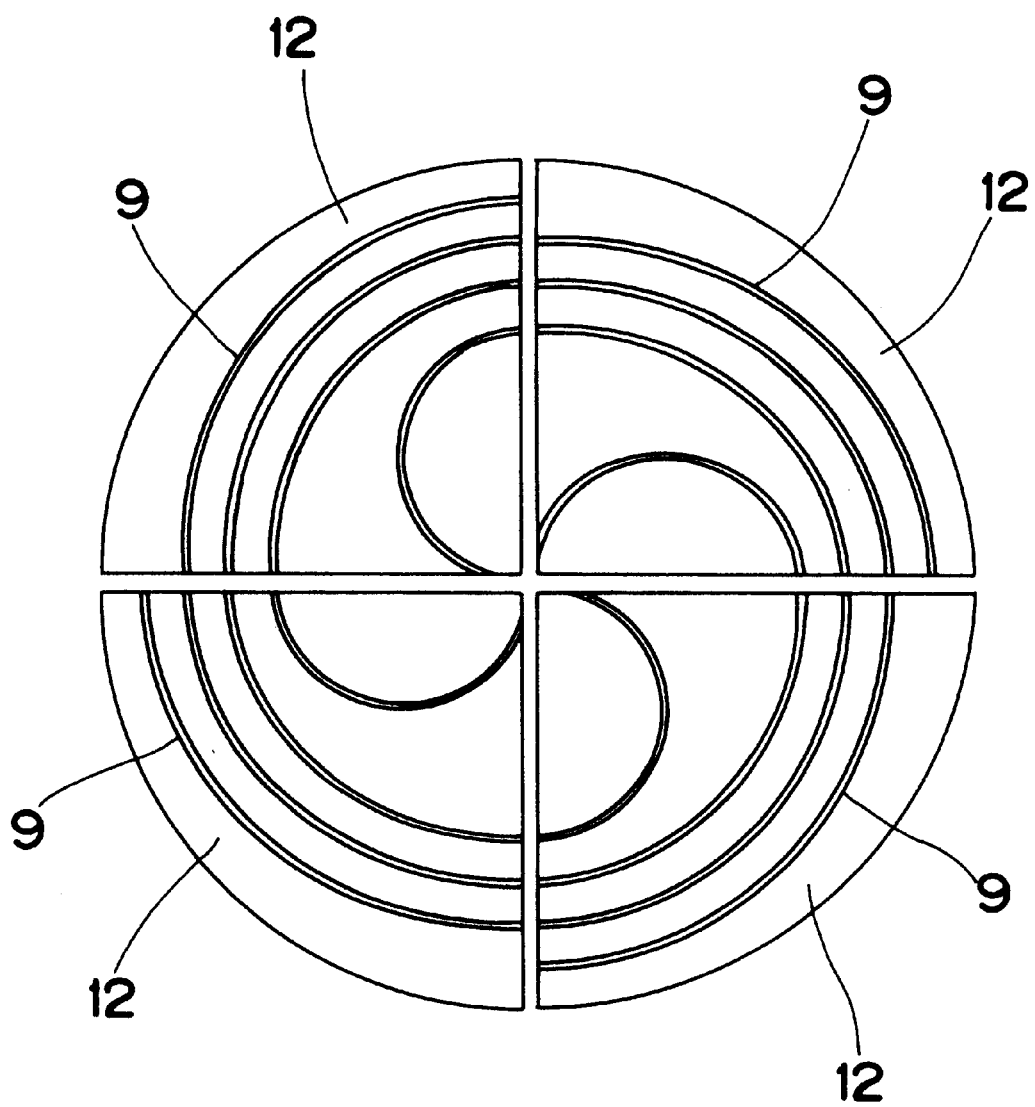
FIG. 17 is a plan view showing the configuration of a free-cutting ceramic plate in a plasma processing apparatus of an eighth embodiment.
Figure 18:
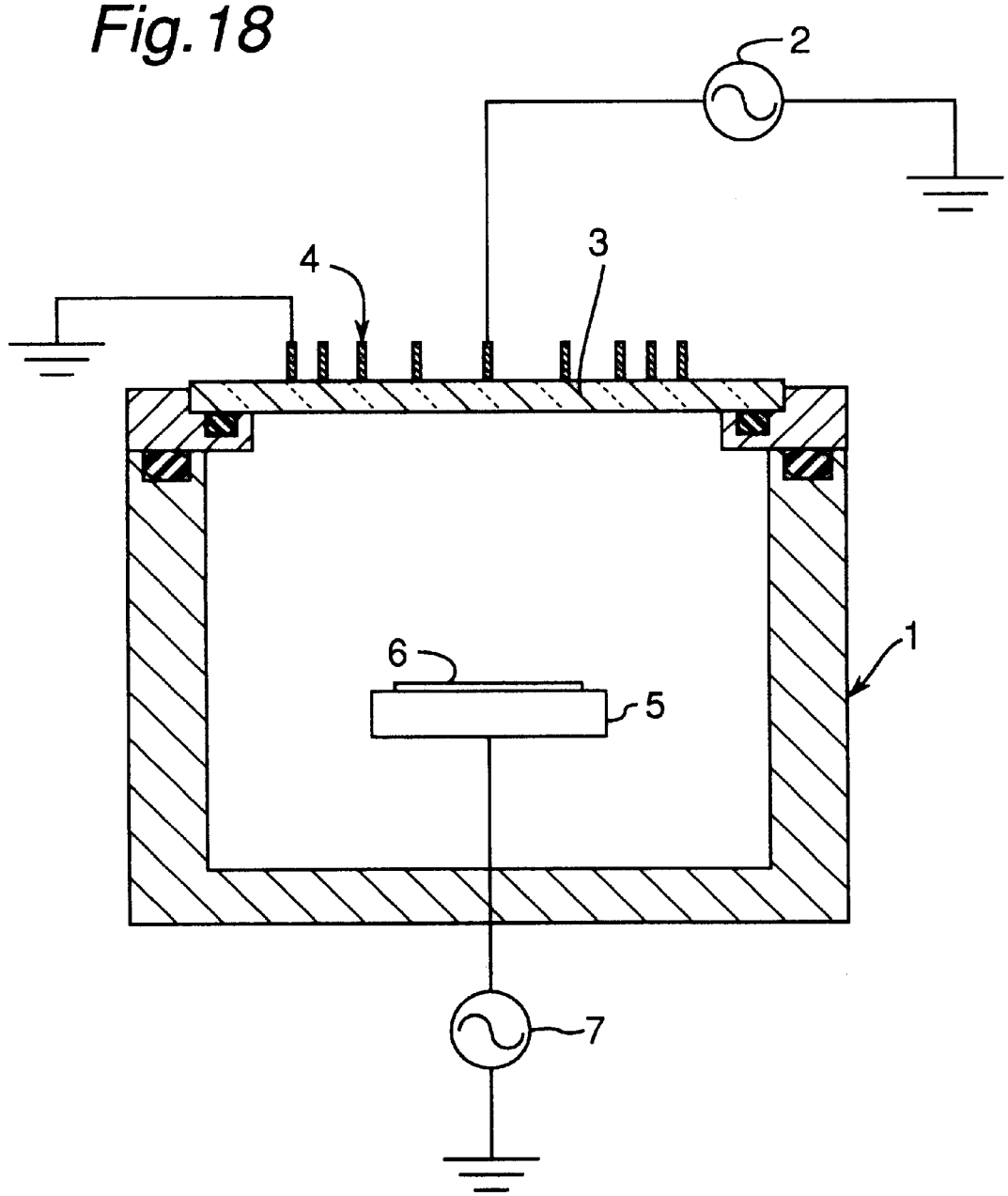
FIG. 18 is a sectional view showing a schematic arrangement of a conventional plasma processing apparatus.
Figure 19:
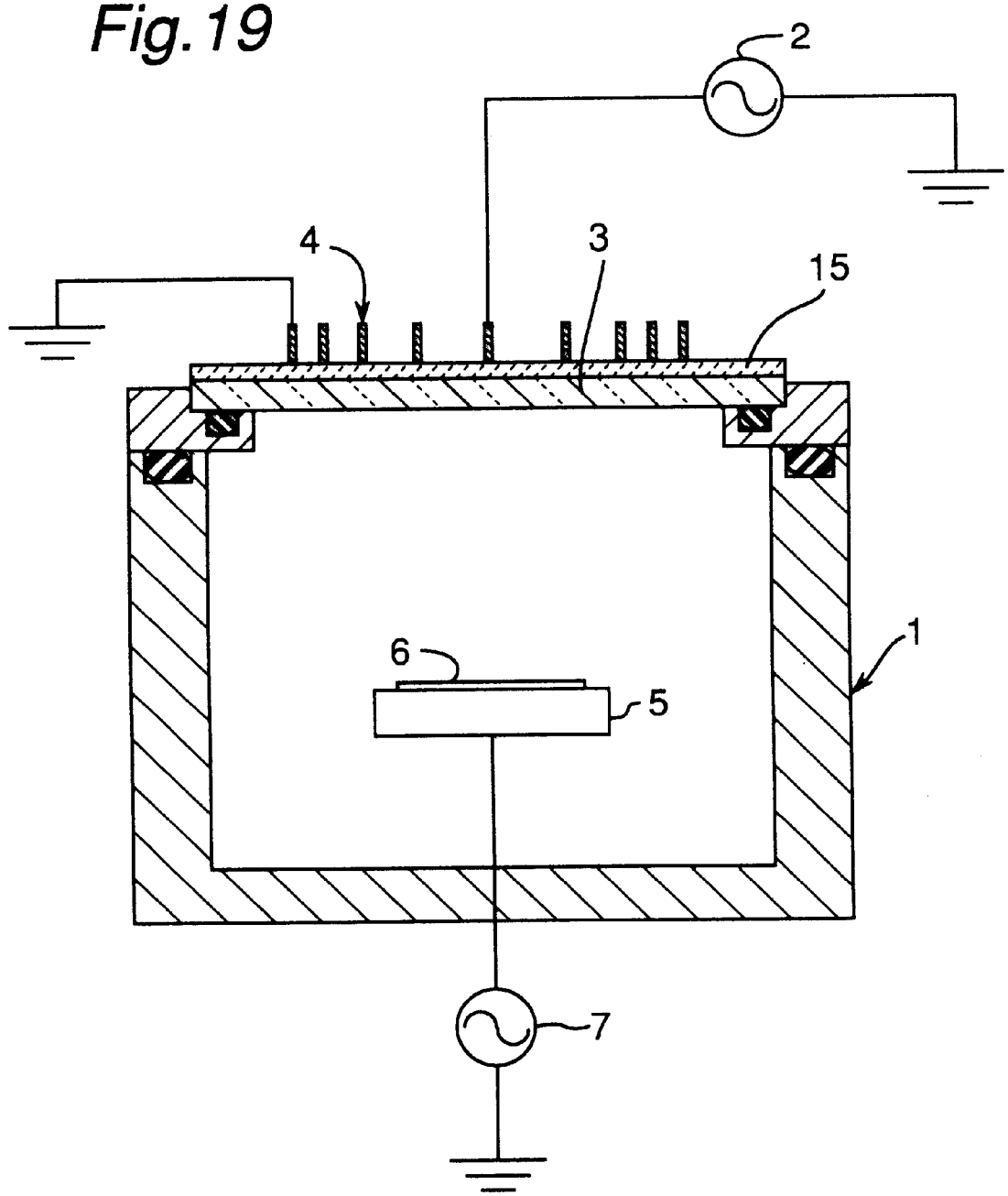
FIG. 19 is a sectional view showing a schematic arrangement of another conventional plasma processing apparatus.

In each of the foregoing embodiments, when a second ceramic plate or glass plate is provided above the planar spiral discharge coil, the engagement between the discharge coil and the ceramic plate(s) or glass plate(s) which is formed with a discharge coil fixing groove(s) is rendered more firm, and this provides for effective prevention of any deformation of the discharge coil. One example in which such arrangement is applied to the foregoing fourth embodiment is shown as a seventh embodiment in FIG. 16. In FIG. 16, reference numeral 14 designates a second ceramic plate or glass plate. Further, by arranging that the planar spiral discharge coil is partially or wholly of multiple spiral configuration, it is possible to provide a plasma processing apparatus having good matching characteristics. In an eighth embodiment wherein such multiple spiral coil configuration is incorporated into the planar spiral discharge coil, the configuration of a free-cutting ceramic plates 12 is shown in FIG. 17.

Figure 15:
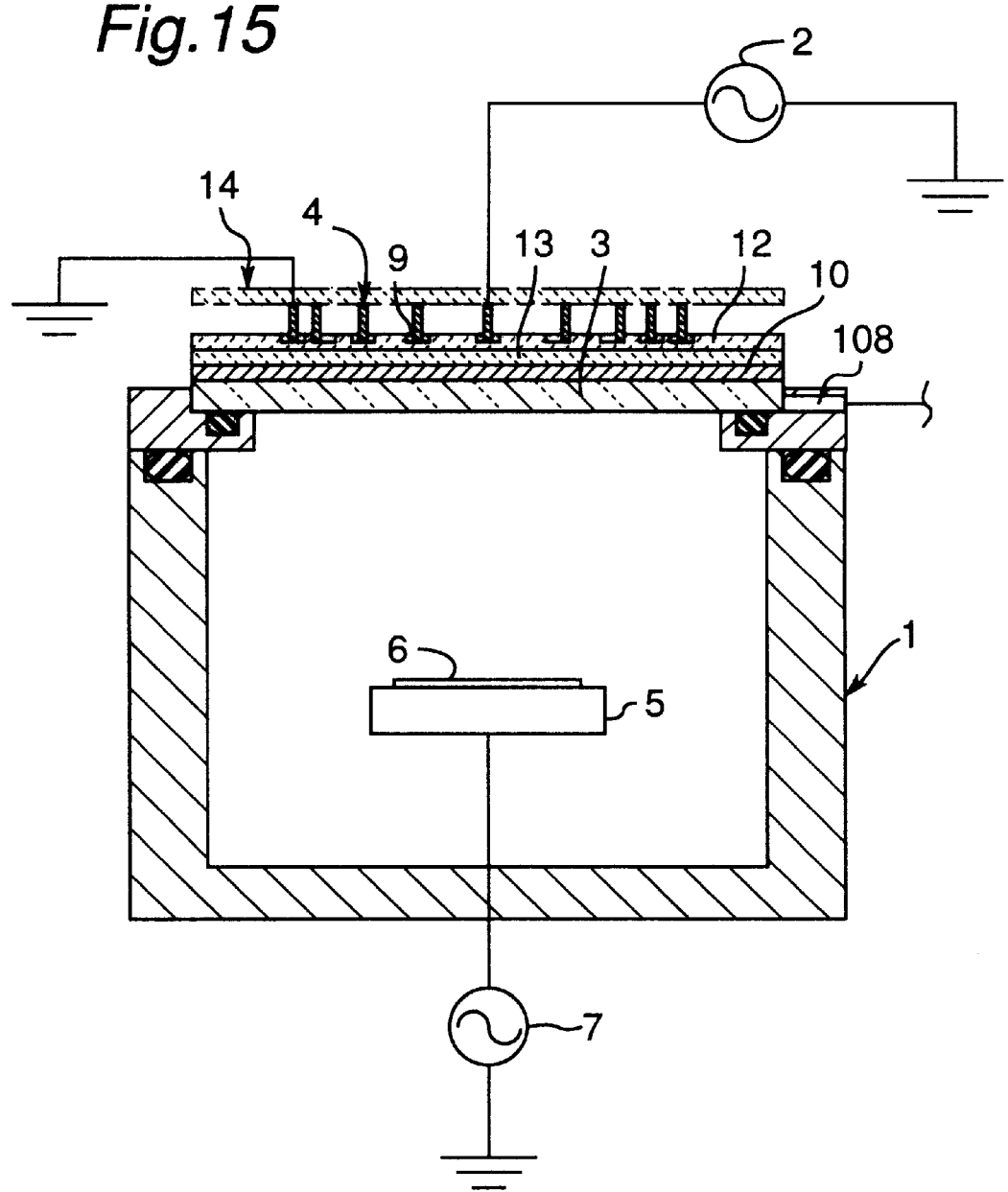
FIG. 15 is a sectional view showing a modified form of the sixth embodiment.

In FIG. 15, the second ceramic plate or glass plate 14 is also shown by two-dot chain lines and the pressure contact type thermocouple 108 is disposed on the side of the dielectric plate 3, for monitoring the temperature of the dielectric plate 3 as one of the best mode.

In the above described sixth and seventh embodiments, the parts into which the free-cutting ceramic plate is divided are four in number. It is understood, however, that the number of such parts is not limited to 4.

According to the arrangement of the plasma processing apparatus of the present invention, as may be clear from the foregoing description, the planar spiral discharge coil is mounted on the ceramic plate which is formed with the discharge coil fixing groove. Therefore, in the event of any rise in the temperature of the dielectric plate due to heating by high energy ions impinging upon the dielectric plate, the engagement between the discharge coil and the ceramic plate is not liable to be damaged, nor is the discharge coil liable to become deformed. Even if the discharge coil should expand due to temperature rise, the ceramic plate is not subject to breakage because the discharge coil and the ceramic plate are not in adhesion bond.

The ceramic plate may be comprised of the free-cutting ceramic material and 5 mm or less in thickness, whereby a plasma processing apparatus which is inexpensive and exhibits good power efficiency can be provided.

Through provision of the planar heater between the ceramic plate and the dielectric plate, it is possible to stabilize the temperature of the dielectric plate, prevent dust generation, and achieve maintenance cycle improvement.

The use of a glass plate in place of the ceramic plate will provide the similar effect. As in the case of the ceramic plate, the glass plate may be 5 mm thick or less, whereby it is possible to provide the plasma processing apparatus which exhibits good power efficiency. Also, through provision of the planar heater between the glass plate and the dielectric plate, the similar effect can be obtained.

Where the planar spiral discharge coil is disposed on the free-cutting ceramic plate which is formed with the discharge coil fixing grooves and divided into plural parts, and where a glass plate or ceramic plate is disposed between the free-cutting ceramic plate and the dielectric plate, the same effect as above mentioned can be obtained. Further, despite the fact that the free-cutting ceramic plate is divided into parts, the presence of the glass plate or ceramic plate prevents any possible occurrence of abnormal electric discharge in the atmosphere.

In the case where the total area of the free-cutting ceramic plate, divided, into plural parts, is larger than 350 cm$^2$, each divisional part of the free-cutting ceramic plate should be 5 mm or less in thickness and 350 cm$^2$ or less in area, and the glass plate or ceramic plate should be 5 mm or less in thickness. With this arrangement, it is possible to provide a plasma processing apparatus which eliminates any possible occurrence of cracks with the free-cutting ceramic plate in the same manner as earlier mentioned, and which is less expensive and can exhibit good power efficiency. The provision of the planar heater between a glass plate or ceramic plate and the dielectric plate can also provide a similar advantage.

In the above described arrangement, the second ceramic plate or glass plate may be provided above the planar spiral discharge coil. This provides more firm engagement between the discharge coil and the ceramic plate or glass plate which is formed with the discharge coil fixing groove (s), and can therefore serve to more effectively prevent deformation of the discharge coil.

Further, by arranging the planar spiral discharge coil such that it is partially or wholly of a spiral configuration, it is possible to provide the plasma processing apparatus having good matching characteristics.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

We claim:

1. A plasma processing method in which an apparatus including a high frequency power source and a spiral discharge coil is employed, said plasma processing method comprising:

applying a high frequency voltage by the high frequency power source to the spiral discharge coil so as to generate a high frequency magnetic field within a vacuum chamber through a dielectric member so that electrons are accelerated by an induction field due to the high frequency magnetic field in order to generate plasma within the vacuum chamber for processing a substrate; and heating the dielectric member with a heating device; and controlling the temperature of the dielectric member to a constant temperature, wherein said heating device for heating said dielectric member comprises a heater which satisfies the relation:

$$Sh < Sy \times 0.4$$

where Sh represents an area of said heater; and Sy represents an area of said dielectric member.

2. The plasma processing method as claimed in claim 1, wherein in the controlling operation, the temperature of the dielectric member is controlled so that the dielectric member is heated by a heating device to 80° C. or more.

3. The plasma processing method as claimed in claim 1, wherein the method is employed for etching a silicon oxide film, and the temperature of the dielectric member is controlled so that the dielectric member is heated to 150° C. or more in the controlling operation.

4. The plasma processing method as claimed in claim 1, wherein the method is employed for etching a silicon nitride film, and the temperature of the dielectric member is controlled so that the dielectric member is heated to 150° C. or more in the controlling operation.

5. The plasma processing method as claimed in claim 1, wherein the spiral discharge coil is partially or wholly of a multiple spiral form.

6. The plasma processing method as claimed in claim 1, wherein in the controlling operation, the temperature of the dielectric member is adjusted while the temperature of the dielectric member is being monitored.

7. The plasma processing method as claimed in claim 1, wherein the spiral discharge coil has a dome-shaped configuration.

8. The plasma processing method as claimed in claim 1, wherein said dielectric member has a dome-shaped configuration.

9. A plasma processing apparatus comprising:
a vacuum chamber;
a dielectric member disposed on said vacuum chamber;
a spiral discharge coil disposed on said dielectric member;
a high frequency power source for applying a high frequency voltage to said spiral discharge coil to generate a high frequency magnetic field within said vacuum chamber through said dielectric member so that electrons are accelerated by an induction field due to the high frequency magnetic field to generate plasma within said vacuum chamber for processing a substrate;
a heating device for heating said dielectric member with resistance heat, wherein said heating device comprises a heater which satisfies the relation:

$$Sh < Sy \times 0.4$$

where Sh represents an area of said heater; and Sy represents an area of said dielectric member; and
a controller for controlling a temperature of said dielectric member, said controller being operably connected to said heating device such that said dielectric member is heated by said heating device to a constant temperature.

10. The plasma processing apparatus as claimed in claim 9, wherein said controller controls the temperature of said dielectric member so that said dielectric member is heated by said heating device to 80° C. or more.

11. The plasma processing apparatus as claimed in claim 9, wherein said spiral discharge coil is partially or wholly of a multiple spiral form.

12. The plasma processing apparatus as claimed in claim 9, further comprising a pressure mounted thermocouple, disposed on a side of said dielectric member, for monitoring the temperature of said dielectric member.

13. The plasma processing apparatus as claimed in claim 9, further comprising a ceramic plate formed with a discharge coil fixing groove, wherein said spiral discharge coil is mounted in said discharge coil fixing groove.

14. The plasma processing apparatus as claimed in claim 13, wherein said ceramic plate has a thickness of 5 mm or less and an area of 350 cm$^2$ or less, and wherein said ceramic plate is comprised of a free-cutting ceramic material.

15. The plasma processing apparatus as claimed in claim 13, wherein said heating device comprises a heater provided between said ceramic plate and said dielectric member.

16. The plasma processing apparatus as claimed in claim 13, further comprising a second ceramic plate or glass plate, wherein said second ceramic plate or said glass plate is disposed above said spiral discharge coil.

17. The plasma processing apparatus as claimed in claim 13, wherein said spiral discharge coil is partially or wholly of a multiple spiral configuration.

18. The plasma processing apparatus as claimed in claim 9, further comprising a glass plate formed with a discharge coil fixing groove, wherein said spiral discharge coil is mounted in said discharge coil fixing groove.

19. The plasma processing apparatus as claimed in claim 18, wherein said glass plate has a thickness of 5 mm or less.

20. The plasma processing apparatus as claimed in claim 18, wherein said heating device comprises a heater provided between said glass plate and said dielectric plate.

21. The plasma processing apparatus as claimed in claim 18, further comprising a second ceramic plate or glass plate, wherein said second ceramic plate or said glass plate is disposed above said spiral discharge coil.

22. The plasma processing apparatus as claimed in claim 18, wherein said spiral discharge coil is partially or wholly of a multiple spiral configuration.

23. The plasma processing apparatus as claimed in claim 9, further comprising:

a free-cutting ceramic plate formed with a discharge coil fixing groove and divided into plural parts, wherein said spiral discharge coil is mounted in said discharge coil fixing groove; and a glass plate or a ceramic plate disposed between said free-cutting ceramic plate and said dielectric plate.

24. The plasma processing apparatus as claimed in claim 23, wherein:

a total area of said plural divided parts of said free-cutting ceramic plate is larger than 350 cm$^2$;

a thickness of each of said divided parts of said free-cutting ceramic plate is 5 mm or less; and an area of each of said divided part of said free-cutting ceramic plate is 350 cm$^2$ or less.

25. The plasma processing apparatus as claimed in claim 23, wherein a thickness of said glass plate or said ceramic plate is 5 mm or less.

26. The plasma processing apparatus as claimed in claim 23, wherein said heating device is provided between said glass plate or said ceramic plate and said dielectric member.

27. The plasma processing apparatus as claimed in claim 23, further comprising a second ceramic plate or glass plate, wherein said second ceramic plate or said glass plate is disposed above said spiral discharge coil.

28. The plasma processing apparatus as claimed in claim 23, wherein said spiral discharge coil is partially or wholly of a multiple spiral configuration.

29. The plasma processing apparatus as claimed in claim 9, wherein said spiral discharge coil has a dome-shaped configuration.

30. The plasma processing apparatus as claimed in claim 9, wherein said dielectric member has a dome-shaped configuration.

31. A plasma processing apparatus comprising:

a ceramic or glass plate formed with a discharge coil fixing groove;

a spiral discharge coil mounted in said discharge coil fixing groove of said ceramic or glass plate, wherein said spiral discharge coil has a dome-shaped configuration;

a high frequency power source for applying a high frequency voltage to said spiral discharge coil to generate a high frequency magnetic field within a vacuum chamber through a dielectric member so that electrons are accelerated by an induction field due to the high frequency magnetic field to generate plasma within said vacuum chamber for processing a substrates;

a heating device for heating said dielectric member with resistance heat, wherein said heating device comprises a heater which satisfies the relation:

$$Sh < Sy \times 0.4$$

where Sh represents an area of said heater; and Sy represents an area of said dielectric member; and a controller for controlling a temperature of said dielectric member, said controller being operably connected to said heating device such that said dielectric member is heated by said heating device to a constant temperature.

* * * * *